United States Patent
Eldridge et al.

(10) Patent No.: US 6,520,778 B1
(45) Date of Patent: *Feb. 18, 2003

(54) MICROELECTRONIC CONTACT STRUCTURES, AND METHODS OF MAKING SAME

(75) Inventors: Benjamin N. Eldridge, Danville; Gary W. Grube, Pleasanton; Igor Y. Khandros, Orinda; Gaetan L. Mathieu, Livermore, all of CA (US)

(73) Assignee: FormFactor, Inc., Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 47 days.

(21) Appl. No.: 09/023,859

(22) Filed: Feb. 13, 1998

Related U.S. Application Data

(63) Continuation-in-part of application No. 08/852,152, filed on May 6, 1997, and a continuation-in-part of application No. 08/819,464, filed on Mar. 17, 1997, and a continuation-in-part of application No. 08/802,054, filed on Feb. 18, 1997.

(51) Int. Cl.$^7$ .............................................. G01R 31/02
(52) U.S. Cl. ......................................... 439/66; 324/762
(58) Field of Search ................................ 324/754, 761, 324/762; 439/66, 81; 205/78

(56) References Cited

U.S. PATENT DOCUMENTS

| | | | |
|---|---|---|---|
| 4,312,117 A | | 1/1982 | Robillard et al. |
| 4,553,192 A | * | 11/1985 | Babuka et al. ................. 439/66 |
| 4,584,039 A | * | 4/1986 | Shea ............................ 205/78 |
| 4,615,573 A | * | 10/1986 | White et al. .................... 439/66 |
| 4,961,052 A | | 10/1990 | Tada et al. |
| 5,032,896 A | | 7/1991 | Little et al. |
| 5,152,695 A | * | 10/1992 | Grabbe et al. ................. 439/66 |
| 5,177,438 A | * | 1/1993 | Littlebury .................... 324/754 |
| 5,191,708 A | | 3/1993 | Kasukabe et al. |

(List continued on next page.)

FOREIGN PATENT DOCUMENTS

| | | |
|---|---|---|
| DE | 19736674 C1 | 11/1998 |
| EP | 413042 A1 | 2/1991 |
| GB | 1446196 | 8/1976 |
| JP | 60025073 | 2/1985 |

(List continued on next page.)

OTHER PUBLICATIONS

Research Disclosure, Kenneth Mason Publications Ltd, England, No 28018, Aug. 1987.*

*Primary Examiner*—Neil Abrams
(74) *Attorney, Agent, or Firm*—O'Melveny & Myers LLP

(57) ABSTRACT

Microelectronic contact structures are fabricated by separately forming, then joining together, various components thereof. Each contact structure has three components: a "post" component, a "beam" component, and a "tip" component. The resulting contact structure, mounted to an electronic component, is useful for making an electrical connection with another electronic component. The post component can be, fabricated on a sacrificial substrate, joined to the electronic component and its sacrificial substrate removed. Alternatively, the post component can be formed on the electronic component. The beam and tip components can each be fabricated on a sacrificial substrate. The beam component is joined to the post component and its sacrificial substrate is removed, and the tip component is joined to the beam component and its sacrificial substrate is removed. In an embodiment of the invention, the beam components of adjacent contact structures are disposed at different heights above the electronic component, whereby at least a portion of the first beam component can overlap at least a portion of the second beam component, thereby conserving space required to accommodate the beam components on the surface of the electronic component.

15 Claims, 16 Drawing Sheets

U.S. PATENT DOCUMENTS

| | | | |
|---|---|---|---|
| 5,199,889 A | * 4/1993 | McDevitt, Jr. | ............... 439/71 |
| 5,308,443 A | 5/1994 | Sugihara | |
| 5,342,737 A | 8/1994 | Georger, Jr. et al. | |
| 5,354,712 A | 10/1994 | Ho et al. | |
| 5,391,521 A | 2/1995 | Kim | |
| 5,452,268 A | 9/1995 | Bernstein | |
| 5,465,611 A | * 11/1995 | Ruf et al. | ...................... 73/104 |
| 5,469,733 A | 11/1995 | Yasue et al. | |
| 5,475,318 A | 12/1995 | Marcus et al. | |
| 5,476,818 A | 12/1995 | Yanof et al. | |
| 5,513,430 A | 5/1996 | Yanof et al. | |
| 5,518,964 A | 5/1996 | DiStefano et al. | |
| 5,606,128 A | 2/1997 | Araki | |
| 5,613,861 A | 3/1997 | Smith et al. | |
| 5,632,631 A | * 5/1997 | Fjelstad et al. | ............... 439/82 |
| 5,656,941 A | 8/1997 | Bishop et al. | |
| 5,666,190 A | 9/1997 | Quate et al. | |
| 5,759,014 A | 6/1998 | Van Lintel | |
| 5,786,270 A | 7/1998 | Gorrell et al. | |
| 5,810,609 A | * 9/1998 | Faraci et al. | ................... 439/71 |
| 5,812,357 A | 9/1998 | Johansen et al. | |
| 5,828,226 A | 10/1998 | Higgins et al. | |
| 5,829,128 A | 11/1998 | Eldridge et al. | |
| 5,848,685 A | 12/1998 | Smith et al. | |
| 5,914,218 A | 6/1999 | Smith et al. | |
| 5,914,614 A | * 6/1999 | Beaman et al. | ............. 324/762 |
| 5,944,537 A | 8/1999 | Smith et al. | |
| 5,966,587 A | 10/1999 | Karavakis et al. | |
| 5,973,394 A | 10/1999 | Slocum et al. | |
| 5,994,152 A | 11/1999 | Khandros et al. | |
| 6,001,663 A | 12/1999 | Ling et al. | |
| 6,023,103 A | 2/2000 | Chang et al. | |
| 6,059,982 A | 5/2000 | Palagonia et al. | |
| 6,080,596 A | 6/2000 | Vindasius et al. | |
| 6,117,694 A | 9/2000 | Smith et al. | |
| 6,140,581 A | 10/2000 | Cowan et al. | |
| 6,194,291 B1 | 2/2001 | DiStefano et al. | |
| 6,204,455 B1 | * 3/2001 | Gilleo | ..................... 174/201 |
| 6,255,126 B1 | * 7/2001 | Mathieu et al. | ................ 438/15 |
| 6,359,455 B1 | * 3/2002 | Takekoshi | .................... 439/66 |

FOREIGN PATENT DOCUMENTS

| | | |
|---|---|---|
| JP | 4214650 | 8/1992 |
| JP | 6018555 | 1/1994 |
| WO | WO 91/12706 | 8/1991 |
| WO | WO 94/09513 | 4/1994 |
| WO | WO 96/37332 A1 | 11/1996 |
| WO | WO 98/52224 A1 | 11/1998 |

* cited by examiner

US 6,520,778 B1

MICROELECTRONIC CONTACT STRUCTURES, AND METHODS OF MAKING SAME

CROSS-REFERENCE TO RELATED APPLICATIONS

This patent application is a continuation-in-part of commonly-owned, co-pending U.S. patent application No. 08/819,464 filed Mar. 17, 1997, which is incorporated by reference herein.

This patent application is a continuation-in-part of commonly-owned, co-pending U.S. patent application No. 08/802,054 filed Feb. 18, 1997, which is incorporated by reference herein.

This patent application is a continuation-in-part of commonly-owned U.S. patent application No. 08/852,152 filed May 6, 1997, now issued as U.S. Pat. No. 6,184,053, which is incorporated by reference herein.

TECHNICAL FIELD OF THE INVENTION

The present invention relates to resilient (spring) electrical contact (interconnection) elements (structures) suitable for but not limited to effecting pressure connections between electronic components and, more particularly, to microminiature spring contacts such as may be used in probing (resiliently and temporarily contacting) microelectronic components such as active semiconductor devices.

BACKGROUND OF THE INVENTION

Commonly-owned U.S. Pat. No. 6,184,053, and its counterpart commonly-owned "divisional" U.S. Pat. Nos. 6,049,976 and 5,852,871, all by KHANDROS, disclose methods for making resilient interconnection elements for microelectronics applications involving mounting an end of a flexible elongate core element (e.g., wire "stem" or "skeleton") to a terminal on an electronic component, and coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Commonly owned U.S. Pat. No. 5,917,707 discloses a number of applications for the aforementioned spring contact element, and techniques for fabricating contact pads at the ends of the spring contact elements. For example, in FIG. 14 thereof, a plurality of negative projections or holes, which may be in the form of inverted pyramids ending in apexes, are formed in the surface of a sacrificial layer (substrate). These holes are then filled with a contact structure comprising layers of material such as gold or rhodium and nickel. A flexible elongate element is mounted to the resulting contact structure .and can be overcoated in the manner described hereinabove. In a final step, the sacrificial substrate is removed. The resulting spring contact has a contact pad having controlled geometry (e.g., sharp points) at its free end.

Commonly-owned U.S. Pat. No. 5,917,707 discloses additional techniques and metallurgies for fabricating contact tip structures on sacrificial substrates, as well as techniques for transferring a plurality of spring contact elements mounted thereto, en masse, to terminals of an electronic component (see, e.g., FIGS. 11A–11F and 12A–12C therein).

Commonly-owned U.S. Pat. No. 5,994,152 discloses techniques whereby a plurality of contact tip structures (see, e.g., #620 in FIG. 6B therein) are joined to a corresponding plurality of elongate contact elements (see, e.g., #632 of FIG. 6D therein) which are already mounted to an electronic component (#630). This patent application also discloses, for example in FIGS. 7A–7E therein, techniques for fabricating "elongate" contact tip structures in the form of cantilevers. The cantilever tip structures can be tapered, between one end thereof and an opposite end thereof. The cantilever tip structures of this patent application are suitable for mounting to already-existing (i.e., previously fabricated) raised interconnection elements (see, e.g., #730 in FIG. 7F) extending (e.g., free-standing) from corresponding terminals of an electronic component (see. e.g., #734 in FIG. 7F).

Commonly-owned U.S. patent application No. 08/819,464 filed Mar. 17, 1997 (status: pending), referenced as a parent application above and incorporated by reference herein, disclose a number of processes and metallurgies for prefabricating contact tip structures on sacrificial substrates, for later joining to ends of spring contact elements, as well as mechanisms for releasing prefabricated components of spring, contact elements from the sacrificial substrates. Many of the processes, metallurgies and mechanisms disclosed therein are directly applicable to the methods and apparatus of the present invention.

Commonly-owned, co-pending U.S. patent application No. 08/802,054 filed Feb. 18, 1997, referenced as a parent application above, discloses a technique for making microelectronic contact structures by masking and etching grooves into a sacrificial substrate (e.g., a silicon wafer), then depositing one or more layers of metallic material into the grooves, then transferring the resulting structures onto an electronic component such as by brazing, then removing the sacrificial substrate so that the fabricated structures are secured at one end to the electronic component and have another end for contacting another electronic component and function as spring contact elements. The present invention takes the concept a step further, providing an alternate technique for fabricating such spring contact elements and mounting them to terminals of electronic components.

Commonly-owned, U.S. Pat. No. 6,184,053, issued from the parent application Ser. No. 08/852,152 referenced above, discloses a technique for making microelectronic contact structures by applying a series of masking layers patterned with openings onto a substrate such as a semiconductor device, then depositing one or more layers of metallic material into the openings, then removing the masking layers. This results in a plurality of spring contact elements having been fabricated on the substrate at lithographically-defined locations.

The present invention addresses and is particularly well-suited to making interconnections to modern microelectronic devices having their terminals (bond pads) disposed at a fine-pitch. The invention is useful for devices with arbitrarily large pitch, but also is particularly useful for fine pitch. As used herein, the term "fine-pitch" refers to microelectronic devices that have their terminals disposed at a spacing of less than 5 mils, such as 2.5 mils or 65 $\mu$m. As will be evident from the description that follows, this is preferably achieved by taking advantage of the close tolerances that readily can be realized by using lithographic rather than mechanical techniques to fabricate the contact elements.

An exemplary application for making fine-pitch pressure connections between electronic components can be found in commonly-owned U.S. Pat. No. 5,974,662, which discloses a probe card assembly including elongate resilient (spring) contact elements mounted to a "space transformer" component. As used herein, a space transformer is a multilayer interconnection substrate having terminals disposed at a first pitch on a one surface thereof and having corresponding terminals disposed at a second pitch on an opposite surface thereof, and is used to effect "pitch-spreading" from the first pitch to the second pitch. In use, the free ends (tips) of the elongate spring contact elements make pressure connections with corresponding terminals on an electronic component being probed (e.g., tested).

Another example of an application for fine pitch spring contact elements can be found in commonly-owned U.S. Pat. No. 6,064,213, which discloses mounting springs on active semiconductor devices.

SUMMARY OF THE INVENTION

An object of the present invention is to provide an improved technique for fabricating microelectronic contact structures, such as spring contact elements.

Another object of the invention is to provide a technique for fabricating microelectronic contact structures, such as spring contact elements, using processes that are inherently well-suited to the fine-pitch, close-tolerance world of microelectronics.

Another object of the invention is to provide a technique for fabricating microelectronic contact structures, such as spring contact elements, that are suitable for probing electronic components such as semiconductor devices, and that is readily scaleable to probing fine-pitch peripheral interconnect structures.

Another object of the invention is to provide a technique for fabricating microelectronic contact structures, such as spring contact elements, that are suitable for socketing electronic components such as semiconductor devices, such as for performing burn-in on said devices.

According to the invention, microelectronic contact structures are fabricated by forming various portions ("components") thereof on a corresponding number of sacrificial substrates, then joining the portions to an electronic component and to one another.

Each contact structure has three portions (components): a base end portion or "post" component, a middle portion or "beam" component, and a contact end portion or "tip" component. The contact structure is useful for making an electrical connection with a terminal of another electronic component, whether by pure pressure connection or by soldering thereto.

For example, for a plurality of contact structures:

(a) The post components of a plurality of contact structures are formed on a one sacrificial substrate, at prescribed spacing from one another which may, for example, correspond to the terminal layout of an electronic component. The post components can then be joined to the terminals (e.g.) of the electronic component. Alternatively, a post component can be fabricated directly on the electronic component.

(b) The beam components of the plurality of contact structures preferably are elongate, each having two opposite ends and two opposite surfaces. One or more beam components are formed on a sacrificial substrate, at prescribed spacing from one another corresponding to the layout of the post components on the electronic component. A beam component can then be joined, such as by one of its ends and by one of its surfaces, to a corresponding post component. A group of beam components can be joined as a group to a corresponding group of post-components.

(c) The tip components of the plurality of contact structures are formed on another sacrificial substrate, at prescribed spacing from one another, preferably corresponding to the terminal layout of another electronic component which is to be contacted by the contact structures. A tip component can then be joined to a corresponding beam component at a position along the beam component which is offset from the post component to which the beam component is joined. The tip component may be joined to an opposite (from the post component) end of the beam component, and may be joined to an opposite (from the post component) surface of the beam component. A group of tip components can be joined as a group to a corresponding group of beam components.

In an embodiment of the invention, the post, beam and tip components of each contact structure are fabricated by applying a patterned masking layer onto a sacrificial substrate, the masking layer having openings extending through to the sacrificial substrate, then depositing one or more layers of metallic material into the openings. The openings in the masking layer are at positions whereat it is desired to fabricate the respective component of the contact structures, and define the geometry (shape) of the respective component of the contact structures. A plurality of contact structures may be fabricated in this manner on the sacrificial substrates, with lithographically-defined tolerances (e.g., dimensions, spacing, alignment).

According to an aspect of the invention, a sacrificial substrate may be provided with a release mechanism which may be a dissolvable layer such as aluminum or multiple metallic layers, either of which will permit the components of the contact structures to be released from the respective sacrificial substrate upon which they are fabricated.

An exemplary sacrificial substrate upon which the components of the contact structures may be fabricated is a silicon wafer, in which case the process of the present invention advantageously utilizes the directionally selective etching of silicon (as, for example, used for micromachining processes) to create an electroform which is used to plate up the components of the contact structures. This approach may optionally employ laser-based ablation of photoresist, as opposed to lithographic development of the photoresist, in order to create the high aspect ratio of width to height which is preferred for fine pitch spacing between the contact structures.

The post, beam and tip components of the contact structures are suitably formed of at least one layer of a metallic material. In the case of the post components, the metallic material(s) should preferably have good rigidity (high yield strength) and be suitable for being joined, such as by brazing or soldering, with respective ones of the beam components. In the case of the beam components, the metallic material(s) should be appropriate to permit the resulting contact structure to function, in use, as a spring contact element (i.e., exhibit elastic deformation) when force is applied to its (free) end, and should be suitable for being joined with respective ones of the post and tip components.

In the case of the tip components, the metallic material(s) should have good electrical contact characteristics, and should be suitable for being joined with respective ones of the beam components. All of the post, beam and tip components should include at least one layer which is a good conductor of electricity. It is desirable that the overall contact structure (which may be a spring contact element) be a good electrical conductor.

In the main hereinafter, microelectronic contact structures which are spring contact elements are discussed. However, the present invention is not limited to contact structures which are spring contact elements. Contact structures having more, or less, rigidity than would be required to function usefully as spring contact elements are within the scope of the present invention.

An exemplary contact structure formed in this manner has a length "L" between its base (post) end and its contact (tip) end. The base end is preferably offset in a first direction from a central (beam) portion of the contact structure, and the contact end is preferably offset in an opposite direction from the central portion. In this manner, the overall contact structure base end is mounted to a terminal of an electronic component, the beam portion is offset from the electronic component and its contact end is further offset, extending well away from the surface of the electronic component to which it is mounted.

In one particularly preferred embodiment, the resulting contact structure is preferably "long and low", having:

a length "L", as measured from one end to another end;

a height "H" measured transverse the length in a direction that is normal (z-axis) to the surface of the sacrificial substrate (and typically normal to the component to which the contact structure is ultimately mounted);

a contact end (tip) portion which is offset in a one direction (e.g., negative along the z-axis) from a central (beam) portion of the spring element by a distance "d1"; and a base end (post) portion which is offset in one direction (e.g., positive z-axis) from the central (beam) portion of the spring element by a distance "d2".

The beam portion of the contact structure is preferably tapered from the one (base) end to the other (contact) end thereof, the contact structure having the following dimensions:

a width "w1" at its base end as measured parallel to the surface of the sacrificial substrate and transverse to the longitudinal axis of the spring element;

a width "w2" at its contact end as measured parallel to the surface of the sacrificial substrate and transverse to the longitudinal axis of the spring element;

a thickness "t1" at its base end, measured along the z-axis; and a thickness "t2" at its contact end, measured along the z-axis; resulting in:

a widthwise taper angle "α" (alpha); and a thickness taper angle "β" (beta).

The tip portion of the contact structure is also suitably provided with a projecting tip feature, said tip feature having a dimension "d3" measured along the z-axis.

There is thus described herein an exemplary contact structure suitable for effecting connections between two electronic components, typically being mounted by its base (post) end to a one of the two electronic components and effecting a pressure connection with its contact (tip) end (e.g., by the projecting tip feature) to an other of the two electronic components, having the following dimensions (in mils, unless otherwise specified):

| dimension | range | preferred |
|---|---|---|
| L | 10–1000 | 60–100 |
| H | 4–40 | 5–12 |
| d1 | 3–15 | 7 ± 1 |
| d2 | 0–15 | 7 ± 1 |
| d3 | 0.25–5 | 3 |
| w1 | 3–20 | 8–12 |
| w2 | 1–10 | 2–8 |
| t1 | 1–10 | 2–5 |
| t2 | 1–10 | 1–5 |
| α | 0–30° | 2–6° |
| β | 0–30° | 0–6° |

These dimensions are illustrative, and are not meant to limit in any way the scope of the claims. Dimensions outside these ranges may be useful according to various choices readily made by one skilled in the art.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar reference numerals. For example, the element 199 may be similar in many respects to the element 299 in another figure. Also, often, similar elements are referred to with similar numbers in a single drawing. For example, a plurality of similar elements 199 may be referred to as 199a, 199b, 199c, etc.

DETAILED DESCRIPTION OF THE INVENTION

A Spring Contact Element

Figure 1A:
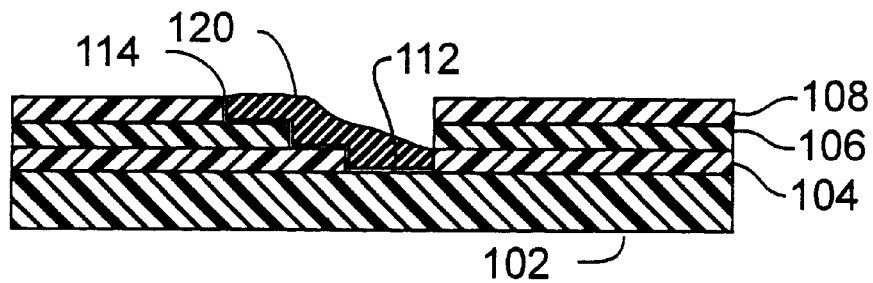
FIG. 1A is a side cross-sectional view illustrating a spring contact element, such as has been disclosed in the aforementioned U.S. patent application No. 08/852,152.
Figure 1B:
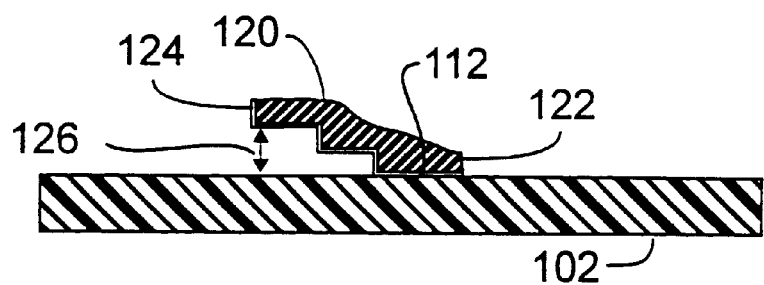
FIG. 1B is a side cross-sectional view of the spring contact element of FIG. 1A.
Figure 1C:
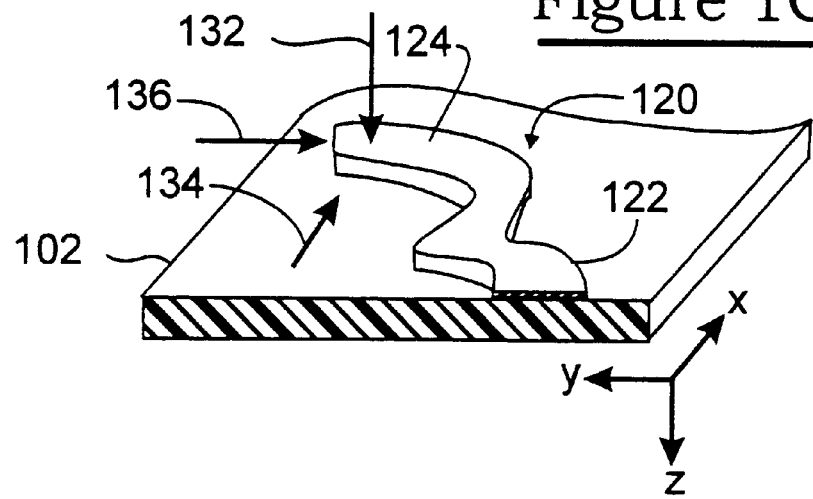
FIG. 1C is a perspective view of the spring contact element of FIG. 1B.

FIGS. 1A–1C corresponding to FIGS. 1A–1C of the aforementioned U.S. patent application No. U.S. patent application No. 08/852,152 illustrate fabricating a plurality (one of many shown) of spring contact elements 120 on an electronic component 102. Generally, a number of insulating layers having openings formed therein are aligned and "seeded" with a layer of conductive material. A mass of conductive material can then be formed (or deposited) in the seeded opening(s), such as by electroplating (or CVD, sputtering, electroless plating, etc.). After the insulating layers are removed, the masses can function as free-standing spring contact structures 120 which extend not only vertically above the surface of the component 102, but also laterally from the location whereat they are mounted. In this manner, the spring contact structures are readily engineered to be compliant in both the Z-axis as well as in the x-y plane (parallel to the surface of the component).

FIG. 1A illustrates an exemplary technique for fabricating one of a plurality of microelectronic contact structures 120 on a substrate 102. The substrate 102, for example, may be an active electronic component, including semiconductor devices, including semiconductor devices resident on a semiconductor wafer (not shown). More generally, the substrate can be a variety of materials. This can be a passive device, such as an interposer or space transformer, or an active device such as a semiconductor device. The material of the substrate might be ceramic or silicon, among other choices. In general, a preferred substrate is one which is amenable to processing under typical semiconductor fabrication conditions.

The substrate 102 has a plurality (one of many shown) of areas 112 on its surface whereat the spring contact elements 120 will be fabricated. In the case of the substrate 102 being an electronic component (such as a semiconductor device), an area 112 preferably would be a terminal (such as a bond pad) of the electronic component.

Generally, a number (three shown) of patterned masking layers 104, 106 and 108 are applied onto the surface of the substrate. The layers are patterned to have openings (as shown) aligned with the area 112, and the openings are sized and shaped so that an opening in a one layer (e.g., 108, 106) extends further from the area 112 than an opening in an underlying layer (e.g., 106, 104, respectively). In other words, the first layer 104 has an opening which may be directly over the area 112. A portion of the opening in the second layer 106 is aligned over at least a portion of the opening in the first layer 104 and, conversely, a portion of the first layer 104 extends under a portion of the opening in the second layer 106. Similarly, a portion of the opening in the third layer 108. is aligned over at least a portion of the opening in the second layer 106 and, conversely, a portion of the second layer 106 extends under a portion of the opening in the third layer 108. The. bottom portion of a given overall opening is directly over the selected area 112 and its top portion is elevated from its bottom portion. In one preferred embodiment, the top portion is laterally offset from the area 112.

As discussed in greater detail hereinbelow, and as discussed in greater detail in the aforementioned U.S. patent application No. 08/819,464, a conductive metallic material is deposited into the opening, and the masking layers are removed, resulting in a free-standing contact structure having been fabricated directly upon the substrate with its base end secured to the substrate 102 at the area 112 and its free end extending both above the surface of the substrate and laterally-displaced from the area 112.

If required, such as for electroplating, a very thin (e.g., 4500 Å) "seed" layer of conductive material 114 such as titanium/tungsten (TiW) may be deposited into the openings. Then, a mass of conductive metallic material (e.g., nickel) 120 can be deposited by electroplating into the openings.

FIGS. 1B and 1C illustrate a resulting spring contact element 120 having its base end 122 adjacent the area 112, and its free-end (tip) 124 elevated in the z-axis above the surface of the substrate 102 as well as laterally offset in the x-axis and y-axis from the base end 122.

As best viewed in FIG. 1C, the contact element 120 will react pressure applied in the z-axis at its tip end 124, as indicated by the arrow 132, such as would result from making, a temporary pressure electrical connection with a terminal (not shown) of another electronic component (not shown). Compliance in the z-axis ensures that contact force (pressure) will be maintained, and also accommodates non-planarities (if any) between terminals (not shown) on the other electronic component (not shown). Such temporary electrical connections are useful for making temporary connections to the electronic component 102, such as for performing burn-in and/or testing of the component 102.

The tip end 124 is also free to move compliantly in the x- and y- directions, as indicated by the arrows 134 and 136, respectively. This would be important in the context of joining (by soldering, or brazing, or with a conductive adhesive) the tip end 124 to a terminal (not shown) of another electronic component (not shown) which has a different coefficient of thermal expansion than the substrate (component) 102. Such permanent electrical connections are useful for assemblies of electronic components, such as a plurality of memory chips (each of which is represented by the substrate 102) to another electronic component such as an interconnection substrate such as a printed circuit board ("PCB"; not shown)

The plurality of spring contact elements 120 can be fabricated with very precise dimensions and very precise spacing from one another. For example, tens of thousands of such spring contact elements 120 are readily precisely fabricated on a corresponding number of terminals on semiconductor devices which are resident on a semiconductor wafer (not shown).

In this manner, there has been shown a method of fabricating spring contact elements (120) directly on a substrate (102) such as an electronic component, such as a semiconductor device which may be resident on a semiconductor wafer, by applying at least one layer of masking material (104, 106, 108) on a surface of the substrate (102) and patterning the masking layer to have openings extending from areas (112) on the substrate to positions which are spaced above the surface of the substrate and which also may be laterally and/or transversely offset from the areas 112); by optionally seeding (114) the openings; by depositing at least one layer of a conductive metallic material into the openings; and by removing the masking material so that the remaining conductive metallic material forms free-standing contact elements extending from the surface of the substrate, each contact element having a base end which is secured to a one of the areas of the substrate and having a tip end for making an electrical connection to a terminal of an electronic component.

The structures (spring contact elements) 120 are principally, preferably entirely, metallic, and may be formed (fabricated) as multilayer structures. Suitable materials for the one or more layers of the contact structures include but are not limited to:

nickel, and its alloys;

copper, cobalt, iron, and their alloys;

gold (especially hard gold) and silver, both of which exhibit excellent current-carrying capabilities and good contact resistivity characteristics;

elements of the platinum group;

noble metals;

semi-noble metals and their alloys, particularly elements of the palladium group and their alloys; and tungsten, molybdenum and other refractory metals and their alloys. Nickel and nickel alloys are particularly preferred.

In cases where a solder-like finish is desired, tin, lead, bismuth, indium and their alloys can also be used.

Another Spring Contact Element

Figure 2A:
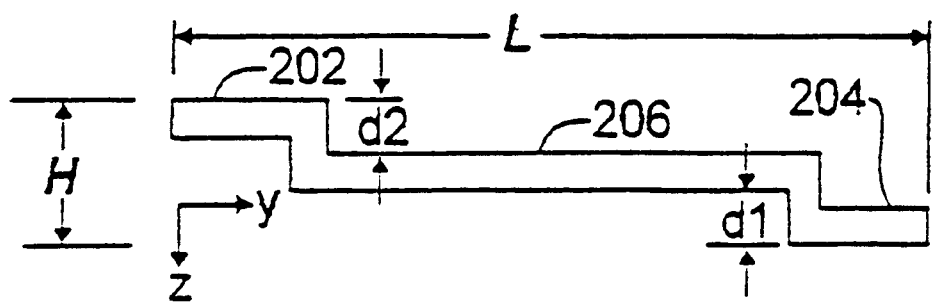
FIG. 2A is a side cross-sectional view of an alternate embodiment of a spring contact element, such as has been disclosed in the aforementioned U.S. patent application No. 08/852,152.
Figure 2B:
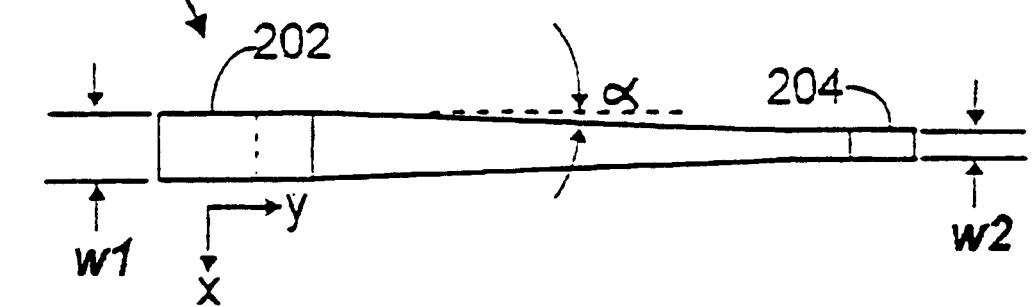
FIG. 2B is a plan view of the spring contact element of FIG. 2A.
Figure 2C:
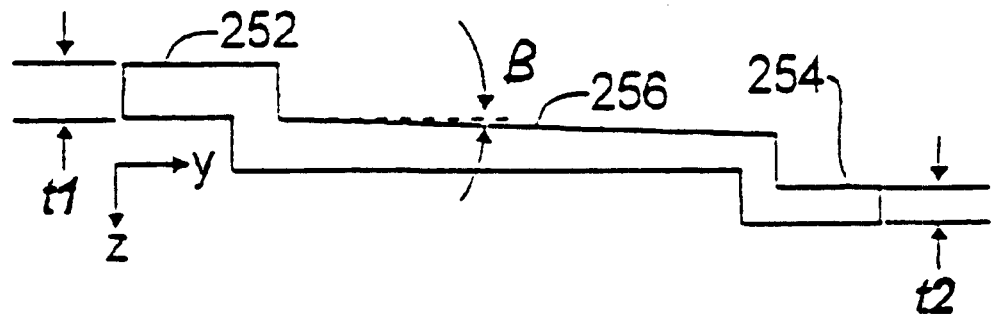
FIG. 2C is a side cross-sectional view of an alternate embodiment of a spring contact element, similar to that shown in FIG. 2B.
Figure 3A:
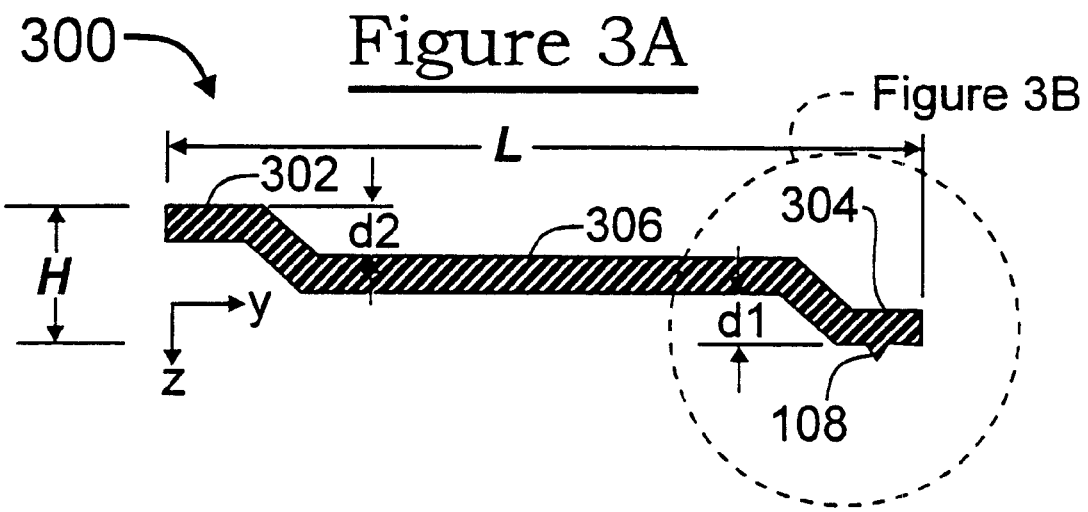
FIG. 3A is a cross-sectional view of a spring contact element, such as has been disclosed in the aforementioned U.S. patent application No. 08/802,054 and its counterpart PCT patent application number US97/08271.
Figure 3B:
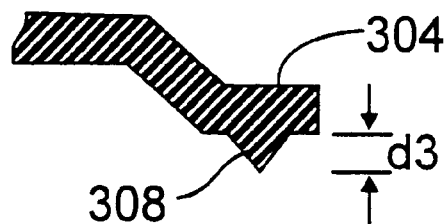
FIG. 3B is an enlarged cross-sectional view of the spring contact element of FIG. 3A.
Figure 3C:
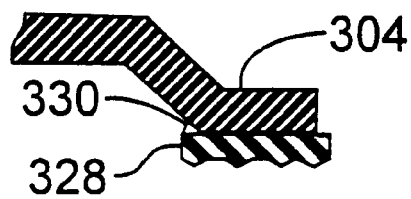
FIG. 3C is a cross-sectional view of an alternate embodiment of a spring contact element, similar to that shown in FIG. 3B.

FIGS. 2A–2C corresponding to FIGS. 3A–3C of the aforementioned U.S. patent application No. 08/852,152 are schematic illustrations of spring contact elements 200 and 250 (compare 120) fabricated according to the techniques of the present invention.

The spring contact element 200 of FIGS. 2A and 2B has a base end portion 202, a contact (tip) end portion 204, a main body portion 206 therebetween, an overall length "L" and an overall height "H". As illustrated, the main body portion 206 is offset a distance "d2" in a one direction from the base end portion 202, and is offset a distance "d1" in another direction from the contact end portion 304.

As best viewed in the top schematic view of FIG. 2B, the contact element 200 can be provided with a widthwise taper "α" so that it is narrower (width "w2") at its contact end 204 than at its base end 202 (width "w1") .

FIG. 2C is a schematic representation of a similar (to the contact element 200) spring contact element 250 that has a base end portion 252 (compare 202), a contact (tip) end portion 254 (compare 204), and a main body portion 256 (compare 206) therebetween. In this example, the contact element 250 can be provided with a thickness taper "β" so that it is thinner (thickness "t2") at its contact end 254 than at its base end 252 (thickness "t1")

Exemplary Dimensions

The spring contact elements of the present invention are particularly well suited to making interconnections between microelectronic components. Suitable dimensions for the spring contact element are (in mils, unless otherwise specified):

| dimension | range | preferred |
|---|---|---|
| L | 10–1000 | 60–100 |
| H | 4–40 | 5–12 |
| d1 | 3–15 | 7 ± 1 |
| d2 | 0–15 | 7 ± 1 |
| d3 | 0.25–5 | 3 |
| w1 | 3–20 | 8–12 |
| w2 | 1–10 | 2–8 |
| t1 | 1–10 | 2–5 |
| t2 | 1–10 | 1–5 |
| α | 0–30° | 2–6° |
| β | 0–30° | 0–6° |

These dimensions are illustrative, and are not meant to limit in any way the scope of the claims. Dimensions outside these ranges may be useful according to various choices readily made by one skilled in the art.

The technique described hereinabove and resulting spring contact elements 120, 200 and 250 are viable, but somewhat limited in that:

(a) it is necessary to apply three masking layers (104, 106, 108), one atop the other, and pattern each masking layer with openings registering with openings in previously-applied layers;

(b) the entire resulting spring contact element is of uniform composition (e.g., of one or more metallic layers throughout its construction);

(c) there is no "tip feature" (described in greater detail hereinbelow) associated therewith.

Another Spring Contact Element

FIGS. 3A–3C corresponding to FIGS. 1A, 1D and 1E, respectively, of the aforementioned U.S. patent application No. 08/802,054 and its counterpart PCT patent application number US97/08271, and illustrate an elongate resilient (spring) contact element 300 that is suitable for attachment as a free-standing structure to an electronic component.

The structure 300 is elongate, has two ends 302 and 304, a central portion 306 therebetween, and has an overall longitudinal length of "L" between the two ends. The length "L" is in the range of 10–1000 mils, such as 40–500 mils or 40–250 mils, preferably 60–100 mils.

The end 302 is a "base" whereat the contact element 300 will be mounted to an electronic component (not shown). The end 304 is a "free-end" (tip) which will effect a pressure connection with another electronic component (e.g., a device-under-test, not shown).

The structure 300 has an overall height of "H". The height "H" is in the range of 4–40 mils, preferably 5–12 mils. (1 mil=0.001 inches=about 25 microns)

As best viewed in FIG. 3A, the structure is "stepped". The base portion 302 is at a first height, the tip 304 is at another height, and a middle (central) portion 306 is at a third height which is between the first and second heights. Therefore, the structure 300 has two "standoff" heights, labeled "d1" and "d2" in the figure. In other words, the spring contact element 300 has two "steps", a step up from the contact end 304 to the central body portion 306, and a further step up from the central body portion 306 to the base end 302.

In use, the structure is often used as a resilient contact member to allow a mechanical and electrical connection between a second electronic device and the substrate upon which the structure is mounted. When the structure. is engaged, a pressure connection moves the tip 304 closer to the substrate (not shown), thus diminishing height "H". The distances d1 and d2 can be chosen to allow displacement of tip 304 by a sufficient amount to provide the desired contact. The contact force will be influenced by the resilience of the structure as it resists compression when brought into contact with the second electronic device. The design and the resiliency of the central portion will influence how much the central portion can flex near the tip 304 versus near the base 302.

The standoff height "d1", which is the "vertical" (as viewed in FIG. 3A) distance between the tip 304 and the central portion 306, is selected in part to prevent bumping of the structure (contact element) with a surface of a component being contacted by the tip end 304.

In use, the standoff height "d2", which is the "vertical" (as viewed in FIG. 3A) distance between the base 302 and the central portion 306, is selected in part to allow the beam (contact element) to bend and be displaced toward the surface of a substrate to which the element is attached.

The dimensions for the standoff heights "d1" and "d2" are:

"d1" is in the range of 3–15 mils, preferably approximately 7 mils±1 mil; and

"d2" is in the range of 0–15 mils, preferably approximately 7 mils±1 mil. In the case of "d2" being 0 mil, the structure would be substantially planar (without the illustrated step) between the central portion 306 and the-base portion 302.

In use, the structure 300 is intended to function as a cantilever beam, and is preferably provided with at least one taper angle, in a manner such as was discussed with respect to FIGS. 2B and 2C.

In contrast to the spring contact structures 120, 200 and 250 described hereinabove, the tip end 304 of the spring contact structure 300 is preferably provided with an integral protruding topological "tip feature" 308, for example in the geometric form of a pyramid, to aid in effecting pressure connection to a terminal of an electronic component (not shown).

The spring contact structure 300 is principally, preferably entirely, metallic, and may be formed (fabricated) as a multilayer structure, suitably employing, for its layers the materials listed hereinabove for layers of other contact structures.

FIG. 3B shows an enlarged view of the contact end 304 of the contact structure 300. In this enlarged view it can be seen that the tip feature 308 is suitably quite prominent, projecting a distance "d3", in the range of 0.25–5 mils, preferably 3 mils, from the bottom (as viewed) surface of the contact end of the spring contact element, and is suitably in the geometric shape of a pyramid, a truncated pyramid, a wedge, a hemisphere, or the like.

The resulting contact structure has an overall height "H" which is approximately the sum of "d1", "d2" (and "d3") plus the thickness of the central body portion when the contact structure is not compressed.

The various dimensions set forth for the spring contact element 300 are in the ranges set forth hereinabove for the spring contact elements 200 and 250 (except for the dimension "d3" which is relevant only to the contact element 300).

Another dimension is of interest—namely, the width and length (i.e., footprint) of the overall tip end (304). In instances where the tip end is expected to make contact with a terminal of an electronic component which is recessed (e.g., a bond pad of a semiconductor device which has passivation material surrounding the bond pad), it may be desirable to ensure that the footprint of the tip end is sufficiently small to make such contact, for example, less than 4 mils by 4 mils. It is particularly useful to make the footprint of the contact end relatively small, for example, 10 microns or even 2 or 3 microns square, to make a penetrating contact feature which will tend to penetrate miscellaneous contaminants on the surface of a contact.

It is desirable that the tip feature 308 is of sufficient height (d3) to make contact with a terminal, which may be recessed below the surface of the second electronic component. Generally speaking, the selection of an appropriate tip end design will be dictated by the peculiarities of the given application. For example, for contacting bond pads on silicon devices, the tip end design illustrated in FIG. 3B would likely be most appropriate. For contacting C4 bumps, the tip end design illustrated in FIG. 3C (described hereinbelow) would likely be most appropriate.

FIG. 3C illustrates an alternate embodiment of a spring contact structure wherein separate and distinct (discrete) contact tip structures 328, such as are described in the aforementioned PCT/US96/08107 can be mounted to the contact end portions 304 of the spring contact elements, such as by brazing 330 thereto. This provides the possibility of the contact tip structure 328 having a different metallurgy, than the spring contact element (300). For example, the metallurgy of the spring contact element (300) is suitably targeted at its mechanical (e.g., resilient, spring) characteristics and its general capability to conduct electricity, while the metallurgy of a contact tip structure 328 mounted thereto is appropriately targeted to making superior electrical connection with a terminal of an electronic component being contacted and, if needed, can have superior wear-resistance.

According to an aspect of the invention, processes such as photolithography are employed to fabricate the spring contact elements of the present invention with tolerances, both of the springs themselves and with regard to the relative locations of a plurality of springs, suitable for use as interconnections in the context of fine-pitch microelectronics.

Mounting and Contacting Spring Contact Elements

Figure 4A:
FIGS. 4A–4B are cross-sectional views illustrating a technique for mounting a plurality of spring contact elements, initially resident on a sacrificial substrate, to another component such as a space transformer component of a probe card assembly, such as has been disclosed in the aforementioned U.S. patent application No. 08/802,054 and its counterpart PCT patent application number US97/08271.
Figure 4B:
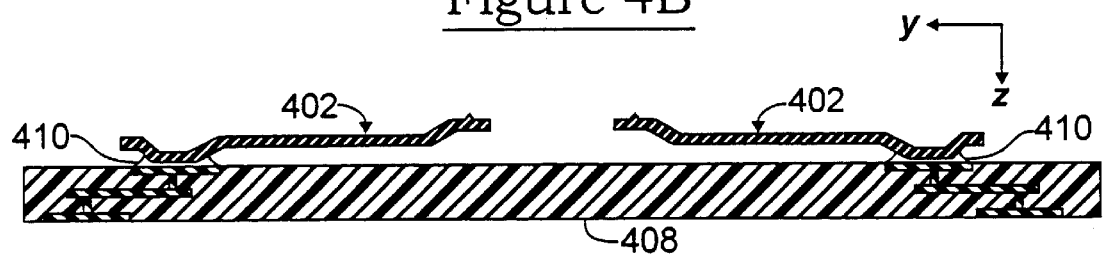
Figure 4C:
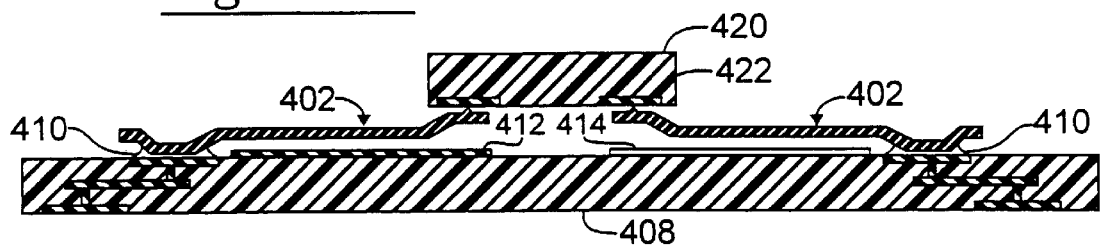
FIG. 4C is a cross-sectional view of a plurality of spring contact elements mounted to a component, such as illustrated in FIG. 4B, in use, probing (making temporary pressure connections with) another component such as a semiconductor device.

FIGS. 4A–4C, corresponding to FIGS. 4A–4C of the aforementioned U.S. patent application No. 08/802,054 and its counterpart PCT patent application number US97/08271, illustrate a technique wherein a plurality (two of many shown) of contact structures 402 (compare 120, 200, 250, 300) have been fabricated on a sacrificial substrate 404. The base end portions of the contact structures 402 are brought into contact with a corresponding plurality of terminals 406 on an electronic component 408, whereupon the base end portions are suitably joined by soldering, brazing or with a conductive adhesive 410 to the terminals 406.

It is within the scope of this invention that any suitable technique and/or material for affixing the base end portions of the contact structures (402) to terminals of an electronic component be employed, including brazing, welding (e.g., spot welding), soldering, conductive. epoxy, tacking the contact structure in any suitable manner to the terminal and securely affixing the contact structure to the terminal by plating (e.g., electroplating), and the like.

The sacrificial substrate 404 is then removed, in any suitable manner, such as by chemical etching or heating), resulting in an electronic component 408 having a plurality (two of many shown) of spring contact elements 402 affixed thereto, as illustrated in FIG. 4B.

As is evident in FIG. 4B, a plurality of elongate spring contact elements can be mounted to an electronic component having a plurality of terminals on a surface thereof. Each spring contact element has a base end and a contact end opposite the base end, and is mounted by its base end of a corresponding terminal of the electronic component. The contact end of each spring contact element extends above the surface of the electronic component to a position which is laterally offset from its base end.

FIG. 4C illustrates an application for the spring contact elements 420 wherein the spring contact elements have been mounted in the manner described with respect to FIG. 4B to a space transformer component (408) of a probe card assembly (not shown) so that the tip features (compare 308) at their contact ends (compare 304) make pressure connections with terminals 422 of an electronic component 420 such as a semiconductor device which may or may not be resident on a semiconductor wafer. As described hereinabove, it is within the scope of this invention that separate and discrete contact tip structures (328) be affixed to the contact end portions of the spring contact elements.

It is within the scope of this invention that the substrate (component) to which the structures 402 are mounted, for example the component 408 illustrated in FIG. 4C is active electronic components, such as memory devices or ASICs.

It is also within the scope of the invention, as is illustrated in FIG. 4C, that the component or substrate to which the structures (e.g., 402) are mounted can be provided with a contiguous (as illustrated) or segmented ground plane to control impedance. Such a ground plane may comprise a plurality of ground lines 412 aligned directly underneath the structures 402, but sufficient clearance for the tip of the structure to deflect must be assured. Alternatively, the ground plane 412 can be covered with an insulating layer. Another approach would be to dispose ground plane lines 414 on the surface of the substrate 408 slightly (such as 1 mil, in the x-axis) offset from directly underneath the structures 402, and laying parallel to the structure 402.

Multilayer Structures

FIGS. 5A–5D, corresponding to FIGS. 2A–2D of the aforementioned U.S. patent application No. 08/819,464 illustrate an exemplary technique for-prefabricating metallic structures 520 which suitably are components of a microelectronic contact structure on a sacrificial substrate 502. In this example, a silicon substrate (wafer) 502 having a top (as viewed) surface is used as the sacrificial substrate.

A layer 504 of titanium is deposited (e.g., by sputtering) onto the top surface of the silicon substrate 502, and suitably has a thickness of approximately 250 Å (1 Å=0.1 nm=$10^{-10}$ m). A layer 506 of aluminum is deposited (e.g., by sputtering) atop the titanium layer 504, and suitably has a thickness of approximately 20,000 Å. The titanium layer 504 is optional and serves as an adhesion layer for the aluminum layer 506. A layer 508 of copper is deposited (e.g., by sputtering) atop the aluminum layer 506, and suitably has a thickness-of approximately 5,000 Å.

A layer 510 of masking material (e.g., photoresist) is deposited atop the copper layer 508, and suitably has a thickness of approximately 2 mils. The masking layer 510 is processed in any suitable manner to have a plurality (three of many shown) of holes (openings) 512 extending through the photoresist layer 510 to the underlying copper layer 508. For example, each hole 512 may be 6 mils in diameter, and the holes 512 may be arranged at a pitch (center-to-center) of 10 mils. The sacrificial substrate 502 has, in this manner, been prepared for fabricating a plurality of contact tip structures at what are "lithographically-defined" locations on the sacrificial substrate 502, within the holes 512.

Exemplary metallic structures 520 may be formed, as follows.

A layer 514 of nickel is deposited, such as by plating, within the holes 512, onto the copper layer 508, and suitably has a thickness of approximately 1.0–1.5 mils. Optionally, a thin layer (not shown) of a noble metal such as rhodium can be deposited onto the copper layer 508 prior to depositing the nickel. Next, a layer 516 of gold is deposited, such as by plating, onto the nickel 514. The multilayer structure of nickel and gold (and, optionally, rhodium) will serve as a pre-fabricated metallic structure suitable for use as one or more of the components of multipart, assembled spring contact elements which are described in greater detail hereinbelow.

Figure 5A:
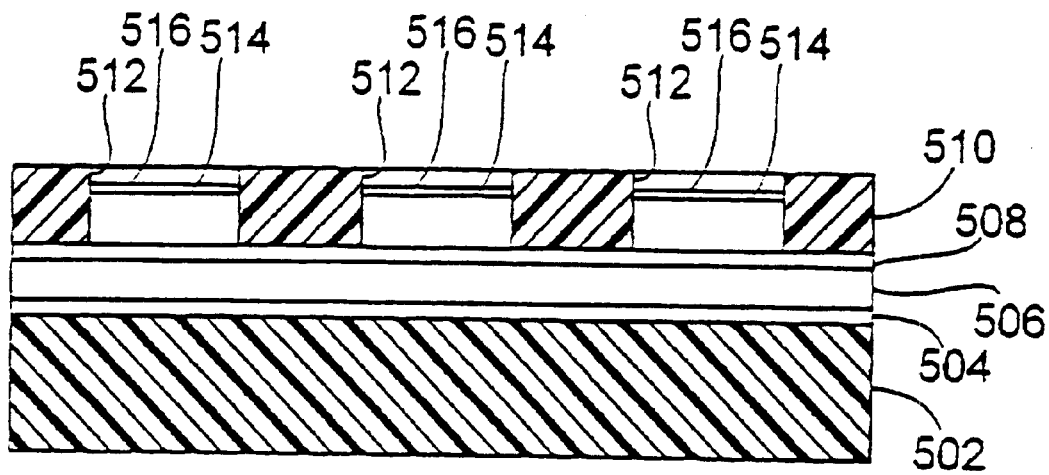
FIG. 5A is a cross-sectional view illustrating fabricating components of a spring contact element, according to the invention.
Figure 5B:
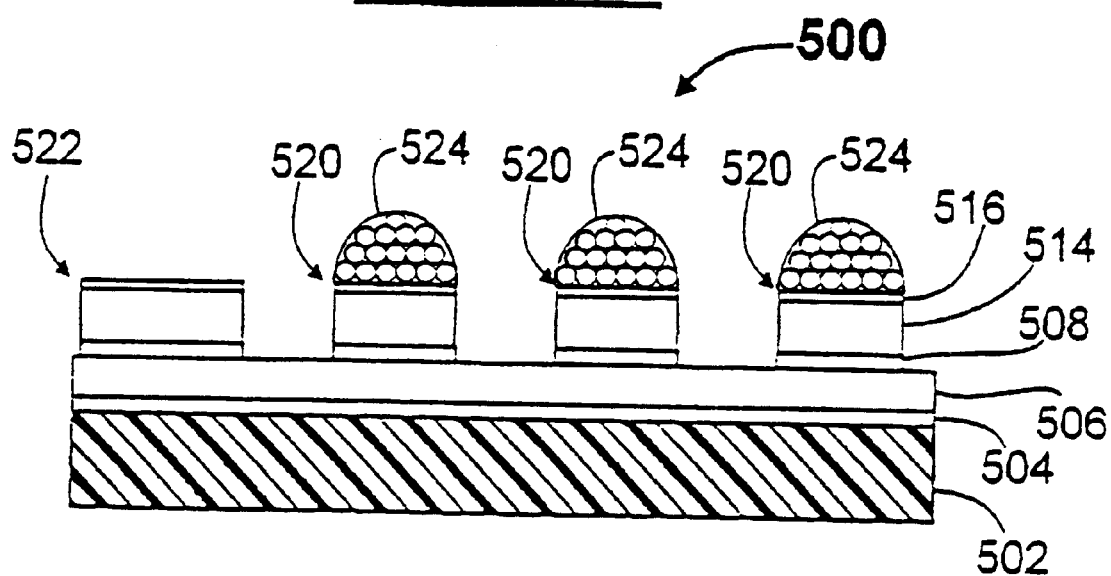
FIG. 5B is a cross-sectional view of a subsequent step related to FIG. 5A, according to the invention.

Next, as illustrated in FIG. 5B, the photoresist 510 is stripped away (using any suitable solvent), leaving a plurality of pre-fabricated metallic structures 520 sitting atop the copper layer 508. Next, the exposed (i.e., not covered by contact tip structures 520) portion of the copper layer 508 is subjected to a quick etch process, thereby exposing the aluminum layer 506. As will be evident, aluminum is useful in subsequent steps, since aluminum is substantially non-wettable with respect to most solder and braze materials.

It bears mention that it is preferred to pattern the photoresist with additional holes (not shown, comparable to 512) within which "ersatz" metallic structures 522 may be fabricated in the same process steps employed to fabricate the actual metallic structures 520. These ersatz structures 522 will serve to uniformize the aforementioned plating steps (514, 516) in a manner that is well known and understood, by reducing abrupt gradients (non-uniformities) from manifesting themselves across the surface being plated. Such structures (522) are typically referred to in the field of plating as "robbers".

In this manner, a plurality of metallic structures 520 have successfully been pre-fabricated on a sacrificial substrate 502, awaiting subsequent joining to terminals of electronic components or to other metallic structures. Optionally, as part of the pre-fabrication of metallic structures (alternatively, immediately prior to joining the metallic structures 520 to terminals or other metallic structures, solder or brazing paste ("joining material") 524 is deposited onto the top (as viewed) surfaces of the metallic structures 520. (There is no need to deposit the paste onto the tops of the ersatz structures 522). This is implemented in any suitable manner, such as with a stainless steel screen or stencil or by automated dispensing of solder paste, as is known in the art. A typical paste (joining material) 524 would contain gold-tin alloy (in a flux matrix) exhibiting, for example, 1 mil spheres (balls).

The metallic structures 520, as fabricated upon and resident upon a sacrificial substrate 502, constitute a product in and of themselves.

As described in the aforementioned U.S. patent application No. 08/819,464, the metallic structures 520 may be contact tip structures suitable for joining to ends of free-standing resilient contact structures resident on an electronic component, in which case the sacrificial substrate 502 with contact tip structures 520 resident thereon is brought to bear upon tips (free ends) of exemplary elongate interconnection elements extending from a substrate which may be an electronic component.

Figure 5C:
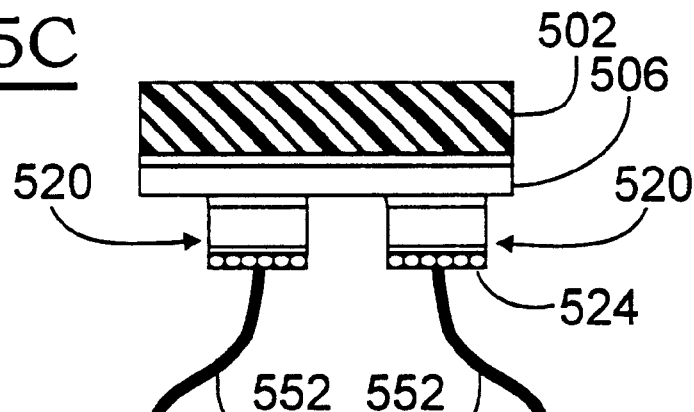
FIG. 5C is a cross-sectional view of a subsequent step related to FIG. 5B, wherein the components are tip components (contact tip structures) and are joined to ends of elongate spring contact elements, such as has been disclosed in the aforementioned U.S. patent application No. 08/819,464.
Figure 5C:
Figure 5D:
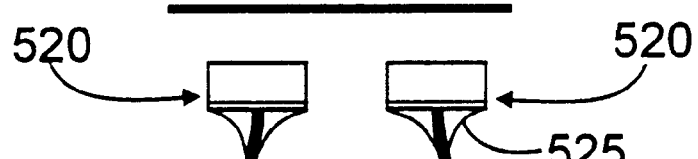
FIG. 5D is a cross-sectional view of a subsequent step related to FIG. 5C, according to the invention.
Figure 5D:

As shown in FIG. 5C, the contact tip structures 520 (only two contact tip structures are shown in the view of FIG. 5D, for illustrative clarity) are aligned with the tips (distal ends) of interconnection elements 552 extending from a surface of an electronic component 554, using standard flip-chip techniques (e.g., split prism), and the assembly is passed through a brazing furnace (not shown) to reflow the joining material 524, thereby permanently joining (e.g., brazing) the prefabricated contact tip structures 520 to the ends of the interconnection elements 532.

During the reflow process, the exposed aluminum layer (506), being non-wettable, prevents solder (i.e., braze) from flowing between the contact tip structures 520, i.e., prevents solder bridges from forming between adjacent contact tip structures.

In addition to this anti-wetting function of the aluminum layer 506, the aluminum layer 506 also serves to provide a release mechanism. Using a suitable etchant, the aluminum is preferentially (to the other materials of the assembly) etched away, and the silicon sacrificial substrate 502 simply "pops" off, resulting in a substrate or electronic component 554 having "tipped" interconnection elements 552, each having a prefabricated tip structure 520, as illustrated in FIG. 5D. (Note that the joining material 524 has reflowed as "fillets" 525 on end portions of the interconnection elements 552.)

In a final step of the process, the residual copper (508) is etched away, leaving the contact tip structures 520 with nickel (or rhodium, as discussed hereinabove) exposed for making reliable electrical pressure connections to terminals (not shown) of other electronic components (not shown).

It is within the scope of the invention that the brazing (soldering) paste (524) is omitted, and in its stead, alternating layers of gold and tin in a eutectic ratio are plated onto the interconnection elements (552) prior to mounting the contact tip structures (520) thereto. In a similar manner, eutectic joining layers can be plated onto the contact tip structures (520) prior to joining with the interconnection elements (552).

Since the contact tip structures (520) are readily fabricated to be coplanar and of uniform thickness, the resulting "tipped" interconnection elements (FIG. 5D) will have tips (i.e., the exposed surfaces of the contact tip structures) which are substantially coplanar. The electronic component (e.g., 554) to which the interconnection elements (e.g., 552) are mounted may be an ASIC, a microprocessor, a component (e.g., space transformer component) of a probe card assembly, and the like.

A Multilayer Structure and a Release Mechanism

Figure 6:
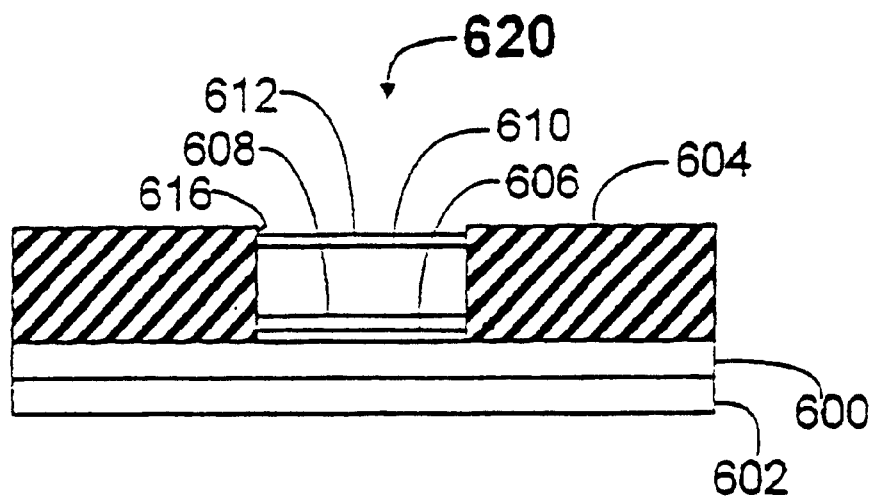
FIG. 6 is a side cross-sectional view illustrating fabricating components of spring contact elements on a sacrificial substrate, according to the invention.

FIG. 6 corresponds to FIG. 4A of the aforementioned U.S. patent application No. 08/819,464 and illustrates a useful (e.g., preferred) technique for forming a multilayer metallic component for a spring contact structure in (or on) a sacrificial substrate, in the following manner, using a thin aluminum layer (foil) 600 as the sacrificial substrate:

- provide a temporary backing 602, such as a plastic sheet, for the foil 600, to increase the structural integrity of the foil (this backing layer 602 can also act as a plating barrier/mask);
- pattern the face (top, as viewed) of the foil 600 with a thin (approximately 3 mil) layer of photoresist 604, or the like, leaving (or creating) openings 616 at locations whereat it is desired to form multilayer metallic components of spring contact structures;
- deposit (such as by plating) a thin (approximately 100 microinch ($\mu$")) layer 606 of hard gold onto the foil 600, within the openings 616 in the photoresist 604;
- deposit (such as by plating) a very thin (approximately 5–10$\mu$") layer ("strike") of copper 608 onto the layer of hard gold (it should be understood that such a copper strike is useful but optional, and is provided principally to assist in subsequent plating of the previous gold layer 606);
- deposit (such as by plating) a relatively thick (approximately 2 mil) layer 610 of nickel onto the copper strike 608 (or, if there is not copper strike, onto the layer 606 of hard gold); and
- deposit (such as by plating) a thin (approximately 100$\mu$") layer 612 of soft gold onto the nickel.

This results in a multilayer structure 620 (compare 520), which is readily joined to either a terminal of an electronic component (not shown) or to another component of a spring contact structure (not shown). The multilayer structure 620 has, as its principal layers, a hard gold surface (606) for contacting (e.g., making pressure connections to) terminals of electronic components (not shown) making the structure 620 particularly useful as a tip component of a spring contact element, a nickel layer (610) providing strength, and a soft gold layer (612) which is readily bonded to (joinable to) a terminal of an electronic component or to another component of a spring contact structure.

Regarding depositing the materials for the structure 620 into the openings 616 of the masking material 604 atop the sacrificial substrate, it should be noted that the sacrificial substrate itself (e.g., 600), or one or more of the blanket layers deposited thereon serve to electrically connect the openings to one another, thereby facilitating the use of electroplating processes to deposit the multiple metallic layers of the structure 620.

In use, the structures 620 can be joined to terminals of electronic components or to other structures in the manner(s) described with respect to FIGS. 4A, 5C and 5D, and the aluminum sacrificial substrate 600 can be removed by means of chemical etching (e.g., with potassium hydroxide).

Another Multilayer Structure and another Release Mechanism

Figure 7:
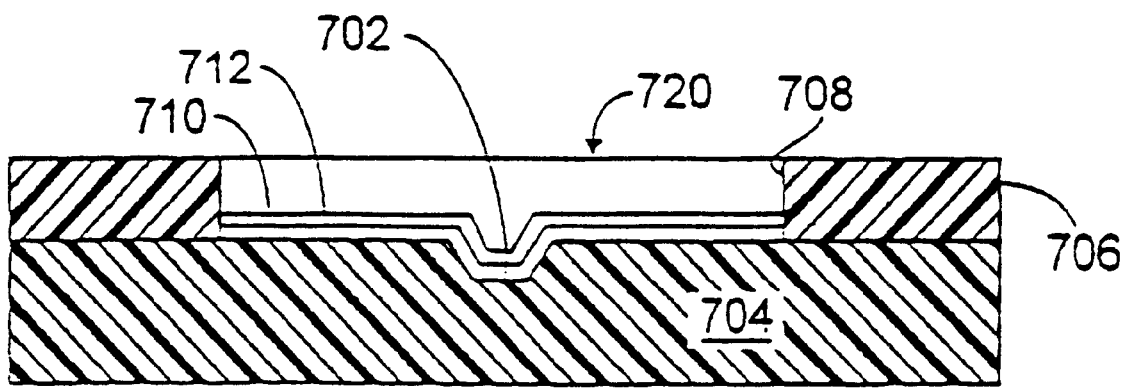
FIG. 7 is a side cross-sectional view illustrating forming tip components (contact tip structures) on a sacrificial substrate and a technique (means) for releasing the tip components from sacrificial substrate, according to the invention.

FIG. 7 corresponds to FIG. 4B of the aforementioned U.S. patent application No. 08/819,464 and illustrates another technique for making components of microelectronic contact structures and releasing them from the sacrificial substrate upon which they are formed. The technique is not dependent on chemical etching (compare FIG. 6) to release the metallic structures from the sacrificial substrate.

As mentioned hereinabove, a "plain" (i.e., no active devices resident thereupon) silicon wafer can be used as the sacrificial substrate upon which the post/beam/tip components of spring contact elements of the present invention may be fabricated. An exemplary metallurgy is set forth hereinabove (FIG. 6), wherein by using a suitable chemical selective etching process, the components of spring contact elements can be released from the sacrificial substrate.

It is within the scope of this invention that an appropriate metallurgy in conjunction with heat can be used to release the components of the spring contact elements from the sacrificial substrate, rather than by using chemical etching. For example, as illustrated by FIG. 7:

Step 1. Etch a pit (one of one or more shown) 702 into a silicon (sacrificial) substrate 704 at a location (one of several shown) whereat it is desired to have a topological feature on a contact tip structure. As discussed hereinbelow, etching of silicon can be self-limiting.

Step 2. Apply a patterned masking layer 706 (e.g., photoresist) onto the surface of the silicon (sacrificial) substrate 704. An opening 708 in the masking layer is at a corresponding location where a corresponding tip component 720 will be fabricated.

Step 3. Deposit (such as by sputtering) a thin layer 710 of a non-wettable (as will be evident) material such as tungsten (or titanium-tungsten) onto. the substrate, within the opening 708 of the masking layer 706.

Step 4. Deposit (such as by sputtering) a thin layer 712 of a non-wetting material such as plateable lead (or indium) onto the thin tungsten layer, within the opening 708 of the masking layer 706.

Step 5. Fabricate a tip component 720 having one or more layers within the opening 708 of the masking layer 706, in the manner described hereinabove (e.g., with respect to FIG. 6).

Step 6. Reflow (using heat) a tip component 720 onto an end of a beam component (not shown) in the manner described hereinabove. During reflow, the thin layer 712 will melt and ball up. For example, tungsten (710) is not wettable with respect to lead (712). This will cause the tip component 720 to be released from the sacrificial substrate 704.

Optionally, a second layer of non-wettable material (e.g., tungsten) can be applied over the layer 712, between layer 712 and tip component 720. Said material will become part of the resulting contact tip structure, unless it is removed (e.g., by etching). In some cases, lead will not ball up (e.g., lead tends to wet nickel), in which cases it may be desired to deposit additional layers such as lead, then tungsten, then lead, to ensure proper release of the contact tip structures from the sacrificial substrate.

Optionally, another layer of material which will ball up when heated (e.g., lead, indium) can be applied over the second layer of non-wettable material (e.g., tungsten). Any residual lead on the surface of the resulting contact tip structure is readily removed, or may be left in place. Alternatively, a layer of a "barrier" material can be deposited between the second layer of material which will ball up and the first layer (e.g., rhodium) of the resulting tip component 720. The "barrier" material may be tungsten, silicon nitride, molybdenum, or the like.

Another Multilayer Structure

FIGS. 8A–8F correspond to FIGS. 5A–5F of the aforementioned U.S. patent application No. 08/819,464 and illustrate a technique for forming metallic structures having pyramid or truncated pyramid tip features on a sacrificial substrate which is a silicon wafer.

Figure 8A:
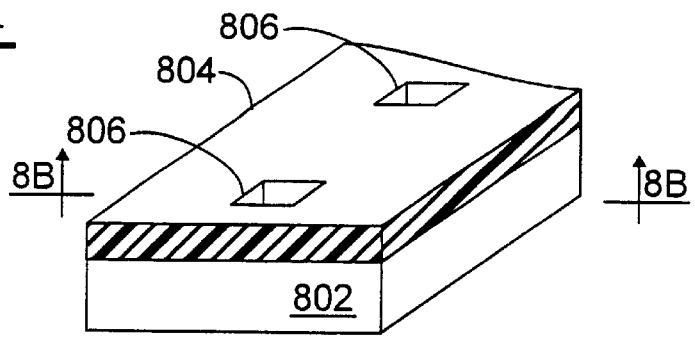
FIG. 8A is a perspective view illustrating a first step in fabricating a plurality of tip components (contact tip structures) on a sacrificial substrate, according to the invention.

FIG. 8A illustrates a first step in the technique, wherein a layer 804 of masking material, such as photoresist, is applied to the surface of the silicon substrate 802, and is patterned to have a plurality (two of many shown) of openings 806 extending to the surface of the silicon substrate 802. The openings 806 are preferably square, measuring approximately 1–4 mils, such as 2.5 mils on a side. However, the openings may be rectangular, or may have other geometric shapes.

Figure 8B:
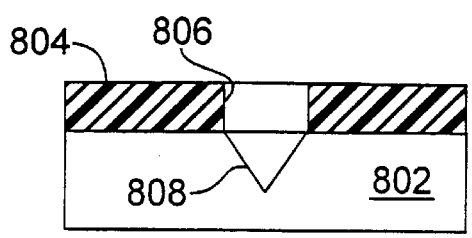
FIG. 8B is a side cross-sectional view, taken on the line 8B—8B through FIG. 8A, illustrating another step in fabricating tip components (contact tip structures) on a sacrificial substrate, according to the invention.

Next, as illustrated in FIG. 8B, the silicon substrate 802 is etched to form a like plurality (one of many shown) of pyramid-shaped depressions 808 in the silicon substrate 802. Such etching of silicon will tend to be self-limiting, as the etching proceeds along the crystal plane at 54.74° for (100) silicon. In other words, the depression will extend to a depth which is defined (dictated) by the size of the opening 806 and the nature of the silicon substrate 802. For example, with a square opening 2.5 mils per side, the depth of the depression will be approximately, 2 mils. Ultimately, depression 808 will become a contact feature integrally formed upon the resulting contact tip structure to be formed on the silicon substrate. This is preferably a photolithographic process, so that the size and spacing of the opening 806 and feature 808 will be extremely precise. Tolerances of microns ($10^{-6}$ meters) are readily attained.

Figure 8C:
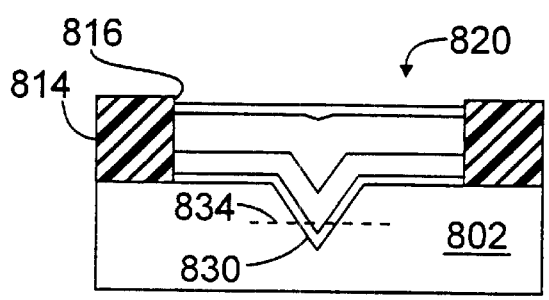
FIG. 8C is side cross-sectional view illustrating another step in fabricating contact tip structures on a sacrificial substrate, according to the invention.

Next, as illustrated in FIG. 8C, the masking material 804 is removed, and a new masking layer 814 (compare 804), such as photoresist, is applied to the surface of the silicon substrate 802 and is patterned to have a plurality (one of many shown) of openings 816 (compare 806) extending to the surface of the silicon substrate 802. The openings 816 are larger than the openings 806, and are generally aligned therewith. (A typical opening 816 is over a depression 808.) An exemplary opening 816 is a rectangle suitably measuring approximately 7 mils (across the page, as shown) by 8–30 mils (into the page, as shown). Ultimately, an opening 816 will be filled with conductive material forming the body of a contact tip structure, being pre-fabricated on the sacrificial substrate 802. This is also preferably a photolithographic process, but the size and spacing of these openings 816 need not be as precise as previous openings 806. Tolerances on the order of up to 1 mil (0.001 inch) are generally acceptable.

Next, as illustrated by FIG. 8C, a multilayer contact tip structure 820 is built up within the opening 816, with a pyramid-shaped tip feature 830 extending from a surface thereof. In this example, the multilayer buildup is suitably:

- first deposit (apply) a release mechanism 822 such as has been described hereinabove (e.g., a multilayer buildup of lead/tungsten/lead);
- then deposit a relatively thin layer 824 of rhodium or tungsten (or ruthenium, or iridium, or hard nickel or cobalt or their alloys, or tungsten carbide), such as 0.1–1.0 mils thick;
- then deposit a relatively thick layer 826 of nickel, cobalt or their alloys;
- finally deposit a relatively thin layer 828 of soft gold, which is readily brazed to.

In this manner, a plurality of elongate contact tip structures 820 can be fabricated, each having a projecting pyramid-shaped contact (tip) feature 830 projecting from a surface thereof. It is this projecting contact feature that is intended to make the actual contact with a terminal (not shown) of an electronic component (not shown)(see FIG. 4C).

Figure 8D:
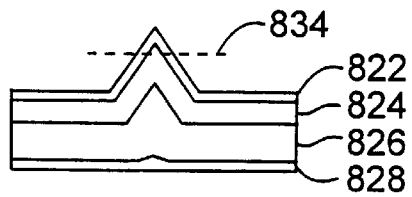
FIG. 8D is a side cross-sectional view illustrating: a contact tip structure which has been fabricated on a sacrificial substrate, such as. has been disclosed in the aforementioned U.S. patent application No. 08/819,464.

As shown in FIG. 8D (and evident in FIGS. 8C, 8E and 8F), the pyramid-shaped contact feature 830 is suitably polished (abraded) off, preferably at a level indicated by the dashed line 834, which will configure the pyramid-shaped feature as a truncated pyramid-shaped feature. The relatively small flat end shape (e.g., a square measuring a few tenths of a mil on a side), rather than a truly pointed end shape, will tend to be sufficiently "sharp" to make reliable pressure connections with terminals (not shown) of electronic components (not shown). This configuration will tend to wear better than a truly pointed feature for making repeated pressure connections to a large number of electronic components, such as would be expected in an application of the tipped interconnection elements of the present invention for probing (e.g., testing silicon device wafers).

Another advantage of polishing off the point of the contact feature 830 is that the second layer of the multilayer buildup can be exposed for making contact with a terminal (not shown) of an electronic component (not shown). For example, this layer can be of a material with superior electrical characteristics, such as rhodium. Or, it can be a material with superior wear characteristics, such as titanium-tungsten. One preferred material is palladium, alloyed with cobalt. Other palladium alloys also are preferred.

Figure 8E:
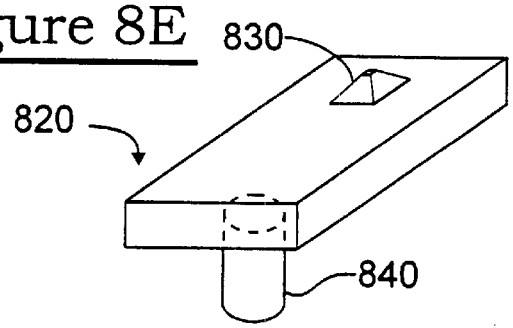
FIG. 8E is a perspective view of an elongate contact tip structure joined to an existing interconnection element, such as has been disclosed in the aforementioned U.S. patent application No. 08/819,464.
Figure 8F:
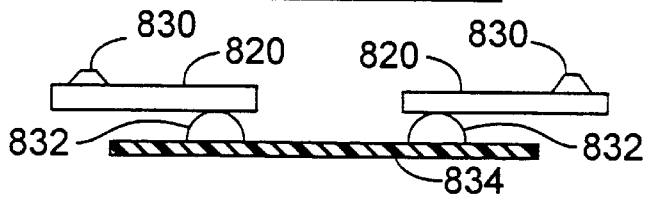
FIG. 8F is a side cross-sectional view of an elongate contact tip structure joined to an existing interconnection element, such as has been disclosed in the aforementioned U.S. patent application No. 08/819,464.

FIG. 8E illustrates the elongate contact tip structure 820 of the present invention joined to an end of an elongate interconnection element 840. FIG. 8F illustrates a plurality of elongate contact tip structures 820 of the present invention, each joined to a contact bump 832 of a membrane probe 834. In these exemplary applications, the contact tip structures 820 having projecting topological contact features 830 provide:

- a distinct metallurgy;
- a distinct contact topology (topography);
- tightly controlled positional tolerances; and
- if desired, a degree of pitch spreading.

Regarding effecting pitch spreading, it can be seen in FIG. 8F that the contact tip structures can be arranged so that the spacing between the contact features 830 is greater (as shown) or lesser (not shown) than the spacing of the contact balls 832.

Generally, in use, the "tipped" interconnection element is mounted to a first electronic component, and the apex (top, as viewed in FIGS. 8E and 8F) portion of the pyramid effects an electrical connection to a terminal (not shown) of a second electronic component (not shown).

As mentioned above, by prefabricating contact tip structures (e.g., 820) with topological contact features (e.g., 830) on a surface thereof, it is possible to achieve extremely high positional precision for the pressure connection to be made, without requiring a comparable degree of precision in either the body portion of the contact tip structure or the interconnection element to which it is joined.

Joining Components Together

There have been described hereinabove some techniques for joining prefabricated contact tip structures (e.g., 328, 520, 820 to ends of spring contact elements, elongate interconnection elements or contact bumps membrane probe (e.g., 304, 552, 840, 832).

Figure 9A:
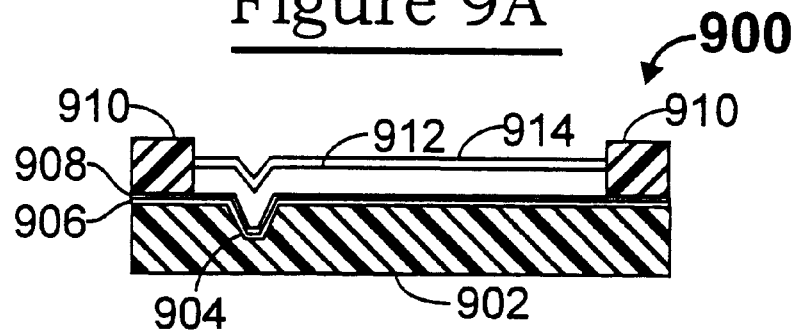
FIG. 9A is a cross-sectional view illustrating. manufacturing elongate contact tip structures on a sacrificial substrate, such as has been disclosed in the aforementioned U.S. patent application No. 08/819,464.
Figure 9B:
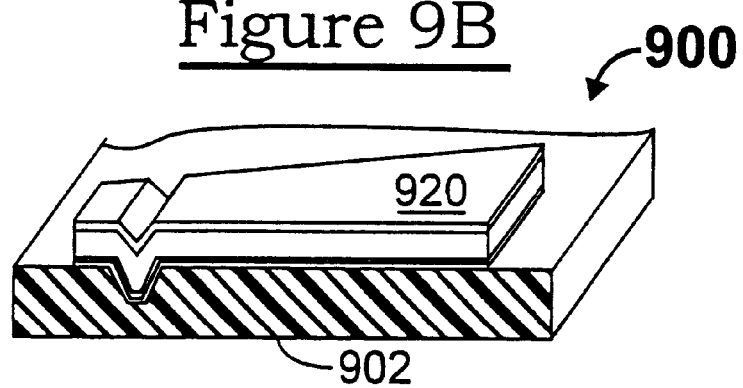
FIG. 9B is a perspective view of the elongate contact tip structure of FIG. 9A.
Figure 9C:
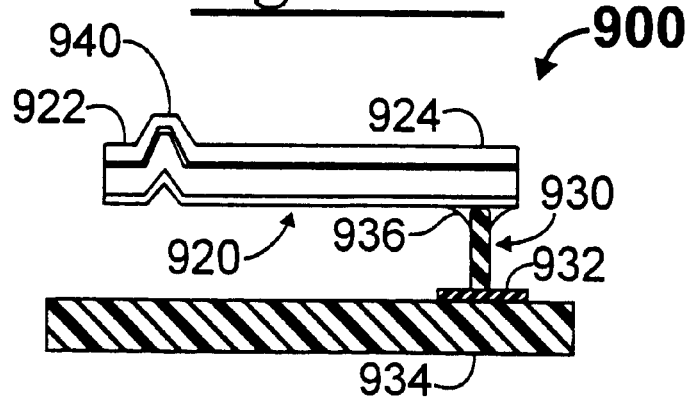
FIG. 9C is a side cross-sectional view, illustrating mounting the elongate contact tip structures of FIGS. 9A and 9B to an electronic component.

FIGS. 9A–9C correspond to FIGS. 7C, 7D and 7F, respectively, of the aforementioned U.S. patent application No. 08/819,464 and illustrate another embodiment of making a contact structure and joining it to an electronic component.

FIGS. 9A–9C illustrate a technique for fabricating contact tip structures which are elongate and which, in use, will function as cantilever (plated cantilevered beam) spring contact elements, and mounting same to terminals of electronic components. These techniques are particularly well suited to ultimately mounting spring contact elements to electronic components such as semiconductor devices, space transformer substrates of probe card assemblies, and the like.

FIG. 9A illustrates a sacrificial substrate 902 such as a silicon wafer, into a surface of which one or more trenches 904 are etched. The trench 904 is illustrative of a surface texture 'template' for the contact tip structure 920 which will be fabricated on the sacrificial substrate 902. The layout (spacing and arrangement) of the trenches 904 can be derived from (e.g. replicate or "mirror") the bond pad layout of a semiconductor die (not shown) which is ultimately (in use) intended to be contacted (e.g., probed). For example, the trenches 904 can be arranged in a row, single file, down the center of the sacrificial substrate. Many memory chips, for example, are fabricated with a central row of bond pads ("lead on center" or LOC).

A hard "field" layer 906 has been deposited upon the surface of the sacrificial substrate 902, including into trench 904. Another layer 908, such as of a plateable material, can optionally be deposited over the field layer 906, if the field layer is of a material which is not amenable to plating such as tungsten-silicide, tungsten, or diamond. (If, as will be evident from the discussion hereinbelow, the layer 906 is difficult to remove, it may be applied by selective deposition (e.g., patterning through a mask), to avoid such removal.)

A masking material 910, such as photoresist, is applied to define an opening 916 for the fabrication of plated cantilever tip structure 920. The opening 916 in the masking layer 910 extends to cover the trench 904. Next, a relatively thick (e.g., 1–3 mils) layer 912 of a spring alloy material (such as nickel and its alloys) is optionally deposited (such as by plating), over which a layer 914 of material such as soft gold is deposited which is amenable to brazing or soldering, in the event that the spring alloy is not easy to bond, solder or braze to. The spring alloy layer 912 is deposited by any suitable means such as plating, sputtering or CVD. Another preferred spring alloy is palladium and its alloys, particularly palladium-cobalt.

Next, as shown in FIG. 9B, the masking material 910 is stripped (removed), along with that portion of the layers (906 and 908) which underlie the masking material 910, resulting in an elongate contact tip structure 920 having been fabricated upon the sacrificial substrate 902. Each elongate contact tip structure 920 has a tip portion 922 (directly over a corresponding one of the trenches 904), a base portion 924, and an intermediate portion 926 between the tip and base portions 922 and 924.

A plurality of such structures 920 may be staggered (oriented left-right-left-right), so that although their tip portions (922) are all aligned in a row (corresponding, e.g., to a central row of bond pads on a semiconductor device), their base portions 924 are oriented opposite one another. In this manner, the spacing between the base portions 924 of the contact tip structures 920 is at a greater (coarser) pitch (spacing) than the tip portions 922.

As mentioned hereinabove with respect to the spring contact structures 200 and 250 is that the intermediate portion 926 can be tapered, from narrowest at the (contact) tip portion 922 to widest at the base portion 924. This feature provides for controllable, determinate amount of deflection of the tip portion 922 when the base portion 924 is rigidly mounted to a terminal of an electronic component such as a space transformer of a probe card assembly or a bond pad of a semiconductor device. Generally, deflection will be localized at or near the tip end of each contact tip structure.

The mechanical design of springs in generally well known in the art, including shape, taper, bending momentum and spring rate.

FIG. 9C illustrates the mounting of a cantilever tip structure 920 to a rigid "pedestal" 930 extending (e.g., free-standing) from a corresponding terminal (one of many shown) 932 of an electronic component 934. Generally, the function of the pedestal 930 is simply to elevate the cantilever tip structure 920 in the z-axis, above the surface of the component 934, so that there is room for the tip end 922 to deflect (downwards, as viewed) when making a pressure connection to a terminal (not shown) of an electronic component (not shown). It is within the scope of this invention that the pedestal 930 itself may be resilient, in which case the cantilever tip structure 920 may or may not also be resilient, as desired for a specific application (use).

As illustrated, a pre-fabricated cantilever tip structure 920 is mounted by its base portion 924 to an end (top, as shown) of the pedestal 930, mounted in any suitable manner such as by brazing or soldering. Here, another advantage of the base portion being the widest portion of the cantilever tip structure 920 is evident, the large base portion of the elongate contact tip structure providing a relatively large surface area for performing such soldering or brazing (shown by the fillet structure 936), affording the opportunity to securely join the base of the elongate contact structure to the pedestal.

It is within the scope of this invention that the pedestal 930 can be any free-standing interconnection element including, but not limited to, a composite interconnection element, and specifically including a contact bump of a probe membrane (in which case the electronic component 934 would be a probe membrane) as well as a tungsten needle of conventional probe card.

As best viewed in FIG. 9C, the tip portion 922 of the cantilever tip structure 920 is provided with a raised tip feature 940 which, in use, effects the actual pressure connection to the terminal (not shown) of the electronic component (not shown). The shape and size of this feature 940 is controlled by the shape and size of the trench 904 (see FIG. 9A).

In any cantilever beam arrangement, it is preferred that a one end of the cantilever be "fixed" and the other end "movable". In this manner, bending moments are readily calculated. Hence, it is evident that the pedestal (930) is preferably as rigid as possible. In the case of the elongate contact structure (920) being joined to a contact bump on a membrane probe, much resilience and/or compliance will be provided by the membrane (934), per se.

A Three-piece Microelectronic Contact Structure

According to the invention, a microelectronic contact structure similar in many regards to the contact structures and spring contact elements and components thereof described hereinabove can be fabricated by joining together three components, each component preferably having been fabricated on a distinct sacrificial substrate, after which the components are joined to an electronic component and to one another. Each contact structure has three components: a "post" component for joining to an electronic component, a "beam" component for joining to the post component, and a "tip" component for joining to the beam component and adapted in use to make an electrical connection with a terminal of another electronic component. In one preferred embodiment, the post is formed directly on the electronic component rather than on a sacrificial substrate.

Making Post Components

Figure 10A:
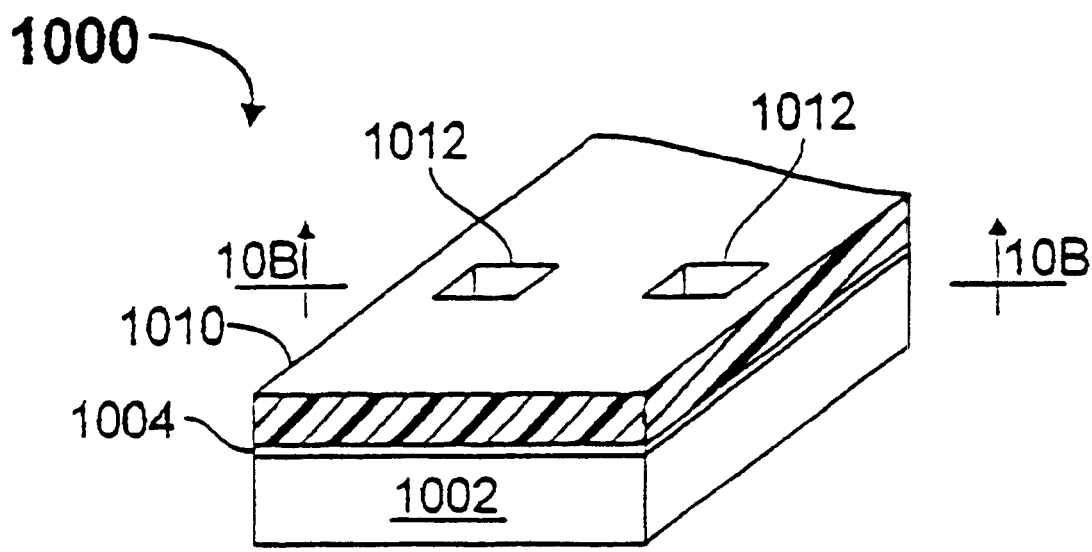
FIG. 10A is perspective view illustrating forming a post component of a spring contact structure, according to the invention.
Figure 10B:
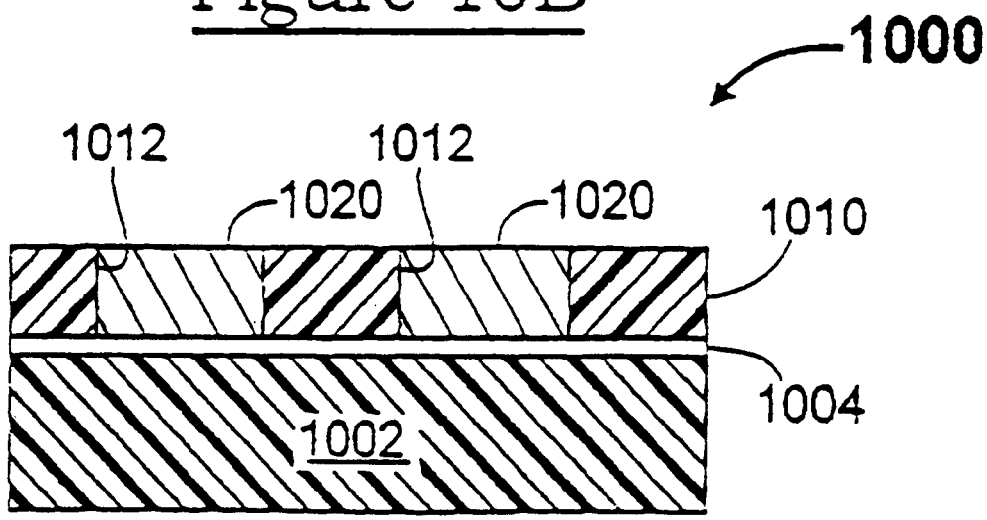
FIG. 10B is a side cross-sectional view taken on a line 10B—10B through FIG. 10A, according to the invention.

FIGS. 10A and 10B illustrate a technique for fabricating a plurality (two of many shown) of post components 1020 for microelectronic contact structures on a sacrificial substrate 1002. In FIG. 10A, which is similar to FIG. 8A, a plurality of openings 1012 (compare 806) are formed in a layer of masking material 1010 which is disposed on a surface of a sacrificial substrate 1002 (compare 802).

Preferably, a release mechanism 1004 is disposed between the sacrificial substrate 1002 and the masking layer 1010. The release mechanism 1004 is any of the release mechanisms described hereinabove, such as the multiple layers 504, 506 and 508 shown and described with respect to FIG. 5A. However, the present invention is not limited to a particular release mechanism. As shown in FIG. 10B, the openings 1012 In the masking layer 1010 are filled, using any suitable process, with one or more layers of metallic material, such as one of the multilayer buildups for components of spring contact elements described hereinabove, resulting in a post components 1020 for spring contact elements.

Joining Post Components to Terminals

Figure 10C:
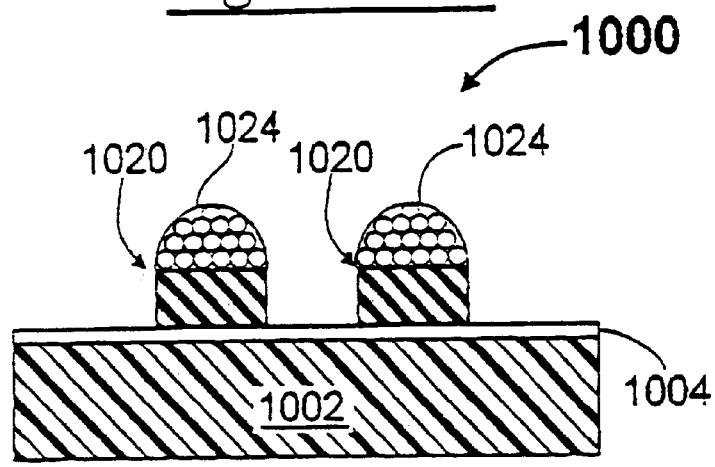
FIG. 10C is a side cross-sectional view illustrating a first step in joining post components to an electronic component, according to the invention.

In a next step of the process, illustrated in FIG. 10C, the masking material 1010 is removed and a joining material such as solder paste 1024 or the like is applied to the exposed (top, as viewed) surfaces of the post components 1020. Compare FIG. 5B. The post components 1020, resident on the sacrificial substrate 1002, with or without the masking material 1010, and preferably prior to applying the solder paste 1024, constitute an interim product which may be warehoused for future use.

Figure 10D:
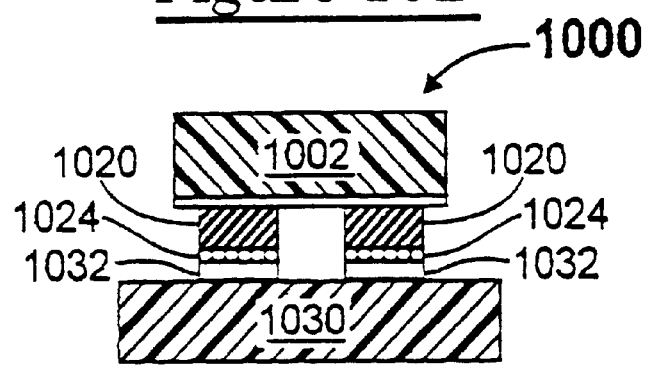
FIG. 10D is a side cross-sectional view illustrating a further step in joining post components to an electronic component, according to the invention.

In a next step of the process, shown in FIG. 10D, the sacrificial substrate 1002 with post components 1020 resident thereon and prepared with solder paste 1024 is brought into contact with an electronic component 1030 which has a plurality (two of many shown) of terminals 1032 on a surface (top, as viewed) thereof. The layout of terminals 1032 on the electronic component 1030 'mirrors' the layout of post components 1020 on the sacrificial substrate 1002, and vice-versa. The terminals and corresponding post components are aligned. Then, by applying heat, the solder paste 1024 is reflowed so that the post components 1020 become joined to the terminals 1032 of the electronic component 1030. With a suitable heat-release mechanism, such as has been described hereinabove, the sacrificial substrate 1002 will release the post components 1020 during the solder reflow heating step.

Else, as described hereinabove, the sacrificial substrate 1002 can chemically be caused to release from the post components 1020.

Figure 10E:
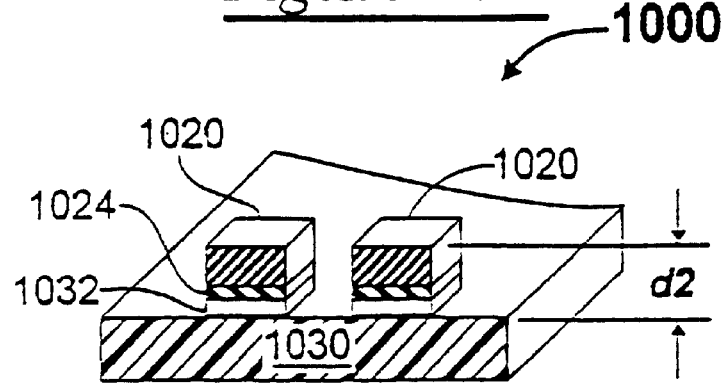
FIG. 10E is a side cross-sectional view illustrating a final step in joining post components to an electronic component, according to the invention.

The end result of the process is that a plurality of post components 1020 has been joined to a corresponding plurality of terminals 1032 on an electronic component, as illustrated in FIG. 10E. Compare the joining of contact tip structures 520 and 920 to the interconnection element 552, 932 of FIGS. 5D and 9C, respectively.

These post components 1020 will serve as base portions (compare 122, 202, 302) of spring contact elements (compare 120, 200, 300) and establish a standoff distance "d2" (compare FIGS. 2A and 3A) between the surface of the electronic component 1030 and a main body portion (compare 206, 306) of a resulting spring contact element in the manner described hereinabove with respect to FIGS. 2A and 3A.

In this and the following examples of joining components of spring contact elements to terminals of electronic components and to one another, the descriptions proceed in terms of solder paste being the joining material and are illustrated prior to reflow as circles, and after reflow-in cross-hatch.

As an alternative to fabricating the post components on a sacrificial substrate, then joining them to terminals of an electronic component, the post components for the microelectronic contact structures of the present invention can be built up directly upon the terminals of the electronic components, by applying a suitable masking layer on the component, patterning the masking layer with openings, and depositing metallic material into the openings, as described hereinabove. See Figure A and the corresponding discussion.

Also, it is within the scope of this invention that the post components can be joined to (or built-up upon) the electronic component at locations other than directly on terminals thereof. Such "remotely-located" post components may be associated with and electrically-connected to corresponding ones of the terminals by conductive traces upon the electronic component.

Making Beam Components

Figure 11A:
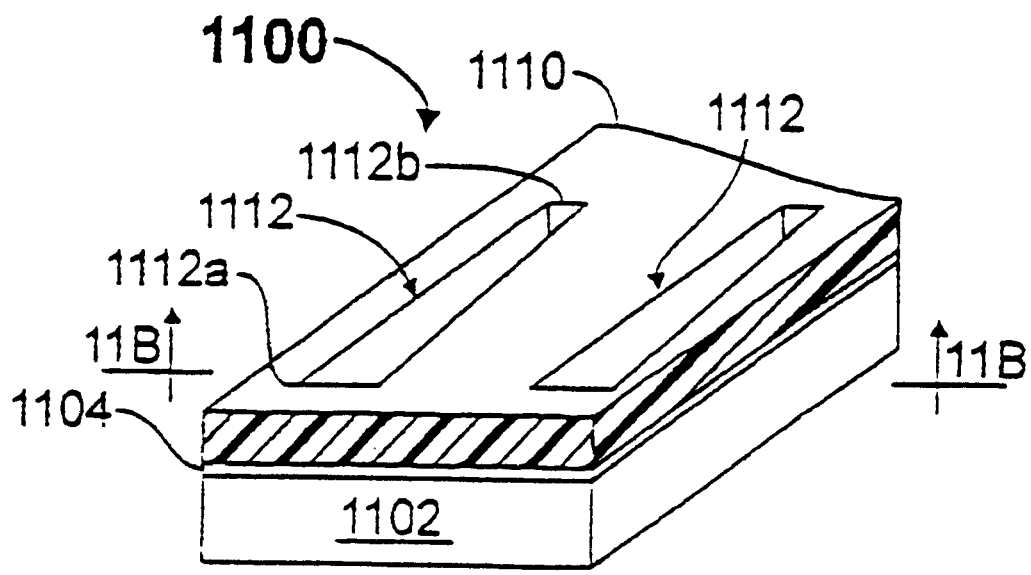
FIG. 11A is perspective view illustrating forming a beam component of a spring contact structure, according to the invention.
Figure 11B:
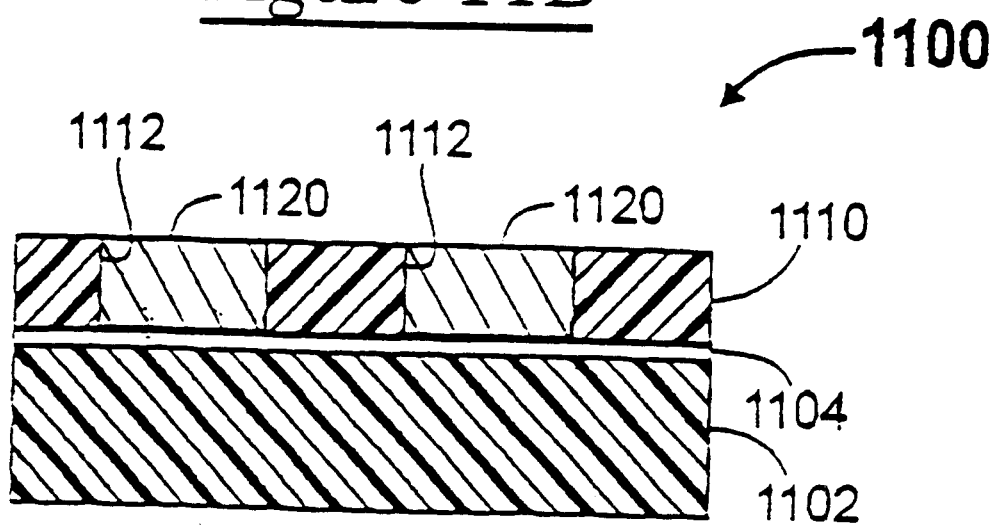
FIG. 11B is a side cross-sectional view taken on a line 11B—11B through FIG. 11A, according to the invention.

FIGS. 11A and 11B illustrate fabricating a plurality (two of many shown) of beam components 1120 for microelectronic contact structures on a sacrificial substrate 1102. In FIG. 11A, which is similar to FIG. 10A, a plurality of openings 1112 (compare 1012) are formed in a layer of masking material 1110 (compare 1010) which is disposed on a surface of a sacrificial substrate 1102 (compare 1002). Preferably, a release mechanism 1104 (compare 1004) is disposed between the sacrificial substrate 1102 and the masking layer 1110. The release mechanism 1104 preferably can be any of the release mechanisms described hereinabove.

For making a beam component 1120, an opening 1112 may be elongate, having a one end 1112*a* and an opposite end 1112*b* which will correspond to the one end 1120*a* and opposite end 1120*b* of the beam component 1120 formed therein. As shown, the one end 1112*a* is somewhat wider than the opposite end 112*b* of the opening 1112 and, as will be seen, the one end 1120*a* of the resulting beam component 1120 will likewise be wider than the opposite end 1120*b* of the beam component 1120 formed therein, in a manner similar to that described hereinabove with respect to the middle portions 206 and 306 of the spring contact elements 200 and 300, respectively. Note that other shapes suitable for making a beam, particularly a resilient beam, are known or within the skill in the art.

As shown in FIG. 11B, the openings 1112 in the masking layer 1110 are filled, using any suitable process, with one or more layers of metallic material, such as one of the multilayer buildups for components of spring contact elements described hereinabove, resulting in a plurality of beam components 1120 for spring contact elements.

Joining Beam Components to Post Components

Figure 11C:
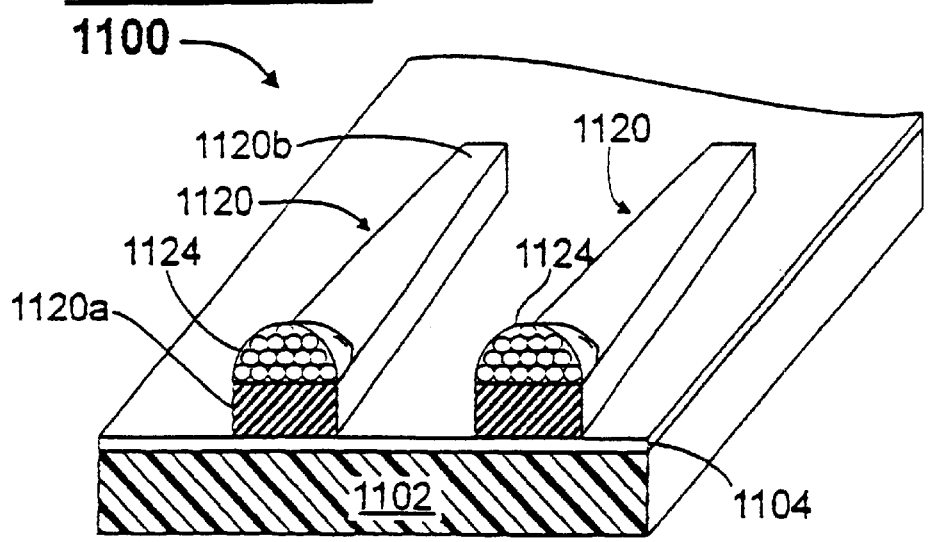
FIG. 11C is a side cross-sectional view illustrating joining beam components to post components on an electronic component, according to the invention.

In a next step of the process 1100, shown in FIG. 11C, the masking material 1110 is removed and a joining material such as solder paste 1124 or the like is applied to a portion of the exposed (top, as viewed) surfaces of the beam components 1120. Compare FIG. 5B. The beam components 1120, resident on the sacrificial substrate 1102, with or without the masking material 1110, and preferably prior to applying the solder paste 1124, constitute an interim product which may be warehoused for future use.

Figure 11D:
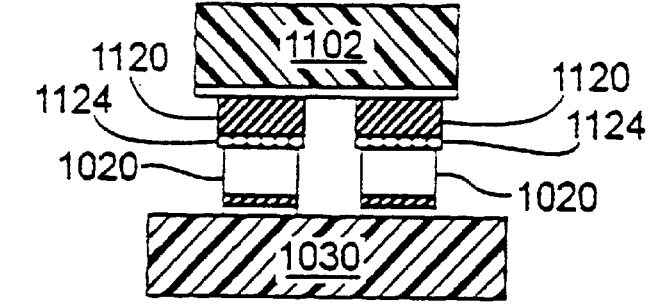
FIG. 11D is a side cross-sectional illustrating joining beam components to post components on an electronic component, according to the invention.

In a next step of the process, shown in FIG. 11D, the sacrificial substrate 1102 with beam components 1120 resident thereon and prepared with solder paste 1124 is brought into contact with a top (as viewed) surface of the post components 1020 which previously were joined to the terminals 1032 of the electronic component 1030. The layout of the one ends 1120*a* of the beam components 1120 'mirrors' the layout of the post components 1020 on the sacrificial substrate 1002, and vice-versa. Then, by applying heat, the solder paste 1024 is reflowed so that the beam components 1120 are joined to the post components 1020. With a suitable heat-release mechanism, such as has been described hereinabove, the sacrificial substrate 1102 will release the beam components 1020 during the solder reflow heating step. Else, as described hereinabove, the sacrificial substrate 1102 can chemically be caused to release from the beam components 1120.

Figure 11E:
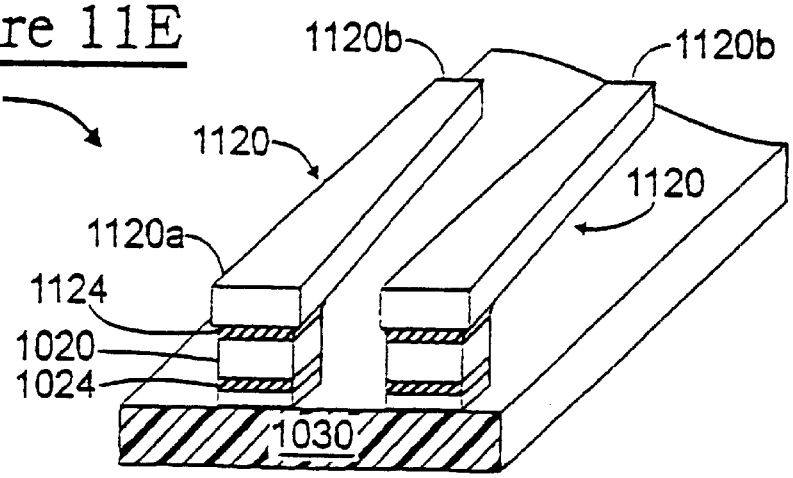
FIG. 11E is a side cross-sectional view illustrating joining beam components to post components on an electronic component, according to the invention.

The end result of the process 1100 is that a plurality of elongate cantilever-like beam components 1120 have been joined by one of their ends to a corresponding plurality of posts 1020 which extend from terminals 1032 of an electronic component 1030, as illustrated in FIG. 11E.

These beam components 1120 are comparable to the main body portions 206 and 306 of the spring contact elements 200 and 300, respectively, described hereinabove and are intended to provide the principal situs of flexure when a contact force is brought to bear upon the tip ends 1120b of the beam components 1120.

Making Tip Components

Figure 12A:
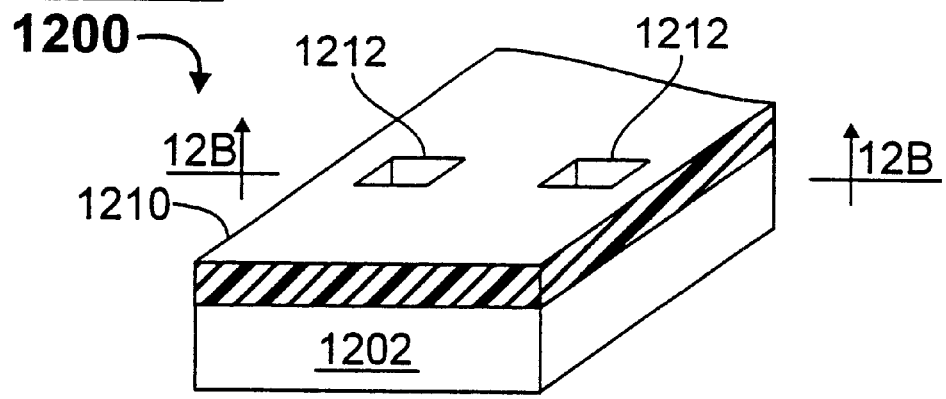
FIG. 12A is perspective view illustrating forming a tip component of a spring contact structure, according to the invention.
Figure 12B:
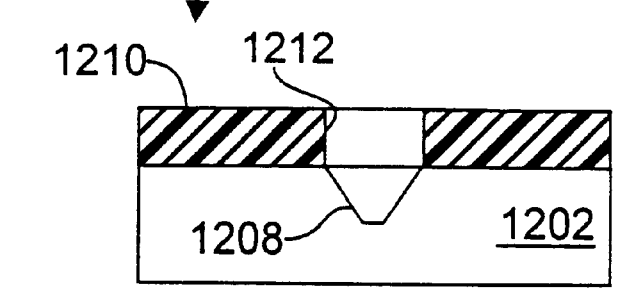
FIG. 12B is a side cross-sectional view taken on a line 12B—12B through FIG. 12A, according to the invention.
Figure 12C:
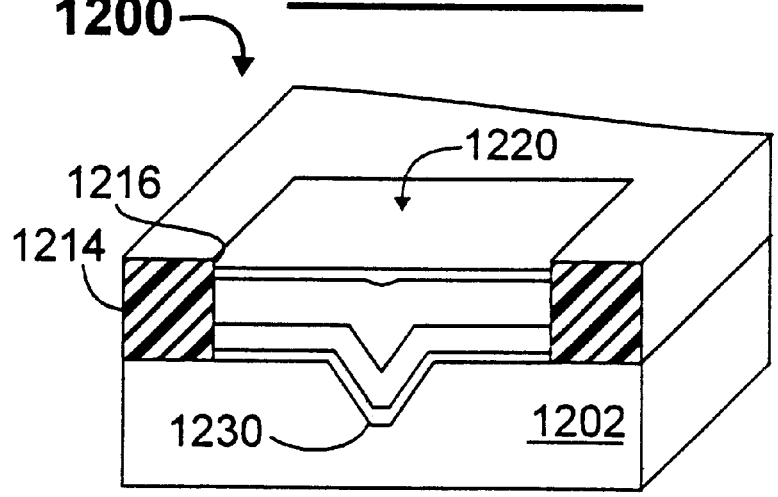
FIG. 12C is a perspective cross-sectional view illustrating the technique for forming a tip component of a spring contact structure, according to the invention.

FIGS. 12A–12C are comparable to FIGS. 8A–8C, and illustrate fabricating a plurality (two of many shown) of tip components 1220 on a sacrificial substrate 1102. In FIG. 12A a plurality of openings 1212 (compare 806) are formed in a layer of masking material 1210 (compare 804) which is disposed on a surface of a sacrificial substrate 1202 (compare 802). Preferably, a release mechanism is incorporated into the fabrication of the tip component 1220, but may alternatively be one or more layers (compare 1004 and 1104) between the sacrificial substrate and the masking layer. The release mechanism preferably may be any of the release mechanisms described hereinabove.

As shown in FIG. 12B, in a first etch step, a pit 1208 (compare 808) is etched into the sacrificial substrate 1202. Taking advantages of the properties of silicon when it etches, a pit in the form of an inverted pyramid can be formed in this manner, by allowing the etching to proceed until it reaches a self-limiting point. Alternatively, as shown, the etching process can be stopped, resulting in the pit having the shape of an inverted truncated pyramid with a small flat apex. Also alternatively, there may be no pit 1208 at all to give, ultimately, a relatively flat tip component 1220.

The masking layer 1210 is then removed, and another masking layer 1214 (compare 814) is applied over the sacrificial substrate 1202 and is patterned to have openings 1216 aligned with the pits 1208. Then the openings. 1216 in the masking layer 1216 are filled, using any suitable process, with one or more layers of: metallic material, such as one of the multilayer buildups for components of spring contact elements described hereinabove (see, e.g., FIG. 8C), resulting in a plurality of tip components 1220, for spring contact elements, each tip component 1220 having a pointed tip feature 1230 (compare 830) integrally formed therewith.

Joining Tip Components to Beam Components

FIGS. 12B and 12C, described hereinabove illustrate making one or a plurality of tip components 1220 on a sacrificial substrate 1202.

Figure 12D:
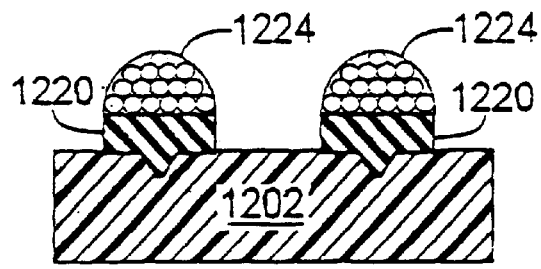
FIG. 12D is a side cross-sectional view illustrating joining tip components to beam components on an electronic component, according to the invention.

In a next step of the process, illustrated in FIG. 12D, the masking material 1216 is removed and a joining material such as solder paste 1224 or the like is applied to the exposed (top, as viewed) surfaces of the tip components 1220. Compare FIG. 5B. The tip components 1220, resident on the sacrificial substrate 1202, with or without the masking material 1216, and preferably prior to applying the solder paste 1224, constitute an interim product which may be warehoused for future use.

Figure 12E:
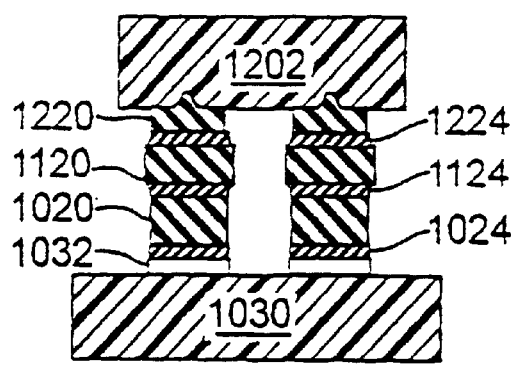
FIG. 12E is a side cross-sectional view further illustrating joining tip components to beam components on an electronic component, according to the invention.

In a next step of the process, shown in FIG. 12E, the sacrificial substrate 1202 with tip components 1220 resident thereon (two tip components 1220 are illustrated in this figure) and prepared with solder paste 1224 is brought into contact with corresponding top (as viewed) surfaces of the opposite ends 1120b of the beam components 1120 which were previously joined by their one ends 1120a to the post components 1020 which were joined to the terminals 1032 of the electronic component 1030. The layout of the tip components 1220 'mirrors' the layout of the opposite ends 1120b of the beam components 1120. The tip components 1220 and corresponding opposite ends 1120b can be aligned and positioned as precisely as desired. These elements can be secured, if desired, before permanent joining. By applying heat, the solder paste 1224 is reflowed so that the tip components 1220 are joined to the beam components 1120. With a suitable heat-release mechanism, such as has been described hereinabove, the sacrificial substrate 1202 will release the beam components 1220 during the solder reflow heating step. Else, as described hereinabove, the sacrificial substrate 1202 can chemically be caused to release from the tip components 1220.

Figure 12F:
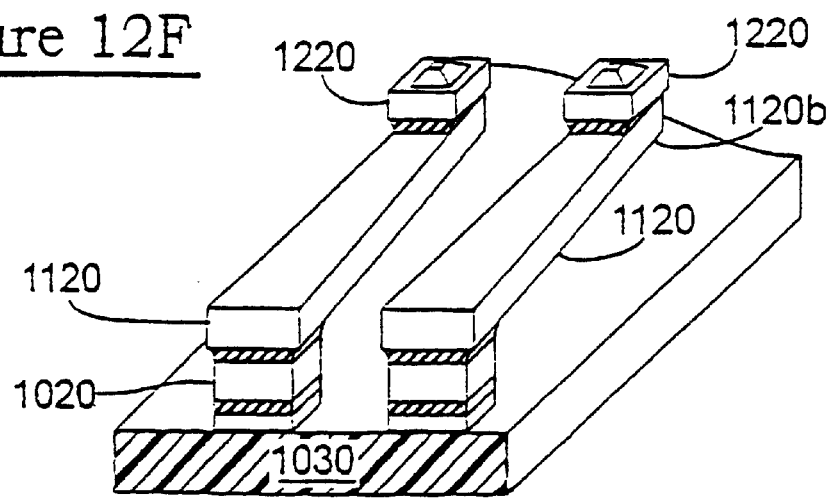
FIG. 12F is a side cross-sectional view further illustrating joining tip components to beam components on an electronic component, according to the invention.

The end result of the process 1200 is that a plurality of tip components 1220 have been joined to ends of beam components 1120 which were joined to post components 1020 extending from terminals 1032 of an electronic component 1030, as illustrated in FIG. 12F.

The end result of the three processes described with respect to FIGS. 10A–12F is that a plurality of microelectronic contact structures has been fabricated in separate pieces (components) which are joined to one another and to the terminals of an electronic component. In this manner, many of the limitations of the prior art processes for forming microelectronic contact structures are overcome. For example, the geometry and metallurgy of each of the post, beam and tip components 1020, 1120 and 1220 can be controlled independently of the geometry and metallurgy of the other of the three components. Similarly, different manufacturing processes can be employed for each of the three components. Additional advantages accrue to this three-piece construction, making possible configurations of spring contact elements on electronic components that otherwise would not be practical using a one-piece construction of a spring contact element.

The Joining Sequence

An example has been set forth hereinabove wherein:
(a) first, post components are joined to or built-up upon the electronic component, such as upon selected terminals of the electronic component;
(b) second, beam components are joined to post components; and
(c) third, tip components are joined to the beam components.

According to this exemplary sequence of events, one having ordinary skill in the art to which the invention most nearly pertains will readily appreciate that the material (e.g., solder paste) used for joining the beam component to the post component should preferably have a higher melting (reflow) temperature than that of the material (e.g., solder paste) used for joining the tip component to the beam component, so that joining the tip component to the beam component does not adversely impact the joint between the beam component and the post component. Moreover, in the case where the post component is first joined (e.g., soldered) to the terminal (or other location) of the electronic component, the material (e.g., solder paste) used for joining the post component to the terminal (e.g.) should preferably have an even higher elting (reflow) temperature than that of the material joining the beam component to the post component, so that joining the beam component to the post component does not adversely affect the joint between the post component and the electronic component. Solder and braze formulations having a wide range of reflow temperatures are readily available, from which appropriate, materials can be selected for each of the joints involved in assembling the microelectronic contact structure. In some cases, conductive adhesive formulations may also be appropriate for selected ones of the joints.

In a similar manner, one skilled in the art can select release mechanisms such as 1004 and 1104 that are compatible with reflow temperatures of the corresponding joining steps. It is within the scope of this invention that other sequences can be employed for joining components of a microelectronic contact structure to one another. For example, the beam components can first be joined to the tip components, then the sacrificial substrate supporting the beam components can be removed (without removing the sacrificial substrate supporting the tip components), then the beam components with tip components already joined thereto can be joined to the post components. This sequence affords the opportunity to utilize a very high melting temperature joining material to effect the joints between the beam components and the tip components, since the electronic component to which the microelectronic contact structures are ultimately joined preferably would not be subjected to the very high temperatures involved. In a similar manner the beam components can first be joined to the post components, then the sacrificial substrate supporting the post components can be removed (without removing the sacrificial substrate supporting the beam components), then the post components with beam components already joined thereto can be joined to the electronic component. This sequence affords the opportunity to utilize a very high melting temperature joining material to effect the joints between the post components and the beam components, since the electronic component to which the microelectronic contact structures are ultimately joined would not be subjected to the very high temperatures involved. Other variations of the joining sequences described hereinabove are within the scope of the invention.

The Resulting Contact Structure

An exemplary microelectronic contact structure having a post component joined to a one end and a one surface of a beam component, and having a tip component joined to an opposite end and an opposite surface of the beam component has been described hereinabove.

It is within the scope of this invention that the post component is joined at other than the one end of the beam component, and that the tip component is joined at other than the opposite end of the beam component. Generally, it is preferred that the tip component be joined at a position on the beam component which is offset from the post component, so that the portion of the beam component extending therebetween can function as a cantilever, and the resulting microelectronic contact structure can function as a spring contact element.

It is similarly within the scope of this invention that the post component is joined to the one surface of the beam component, and that the tip component is joined to the beam component at other than the opposite surface of the beam component. For example, in certain applications it may be desired to mount both of the post and tip components to the same surface of the beam component. Or, it may be desired to mount the tip component to a surface of the beam component which is adjacent, rather than opposite, the surface of the beam component to which the post component is joined.

Overlapping Spring Contact Elements

Figure 13A:
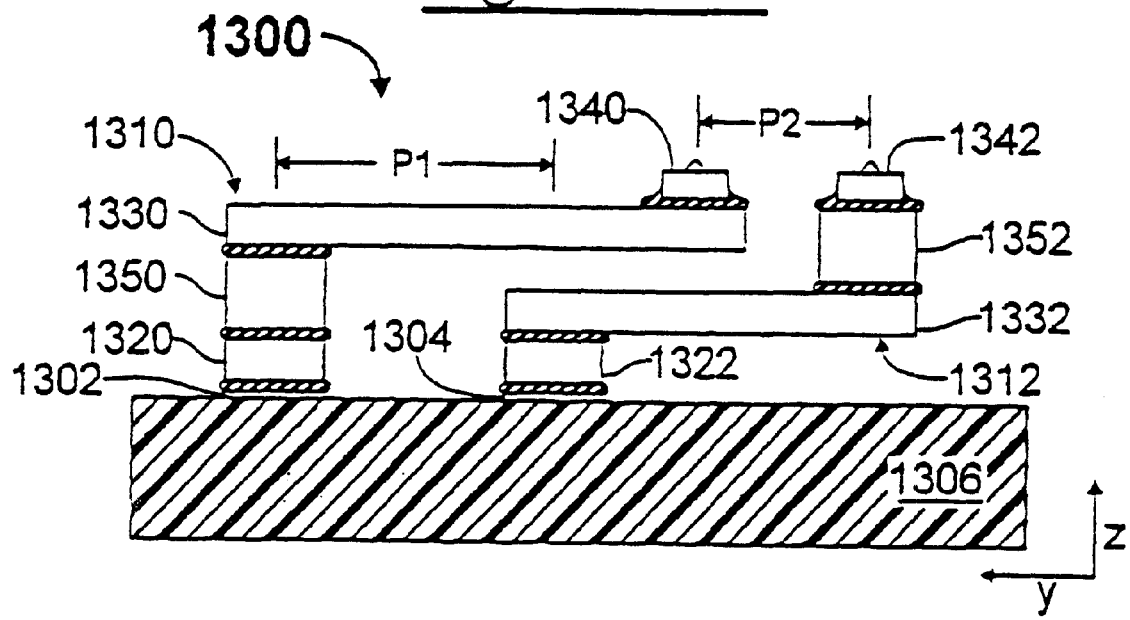
FIG. 13A is a side cross-sectional view illustrating mounting spring contact elements on an electronic component, according to the invention.
Figure 13B:
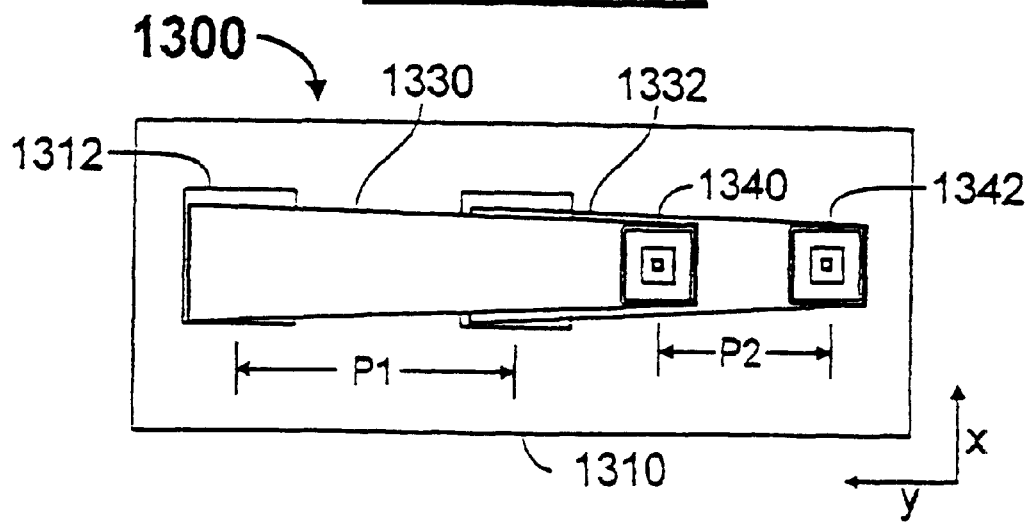
FIG. 13B is a top plan view of FIG. 13A, according to the invention.

FIGS. 13A and 13B illustrate mounting a plurality (two of many shown) of three-piece spring contact elements 1310 and 1312 to a corresponding plurality of terminals 1302 and 1304, respectively, of an electronic component 1306 in a configuration 1300 wherein the beam components 1330 and 1332, respectively, of the spring contact elements 1310 and 1312 are overlapping (e.g., have common coordinate, but different z-axis coordinates).

The terminals 1302 and 1304 are spaced a distance "P1" apart on the surface (top, as viewed) of the electronic component 1306. The two terminals 1302 and 1304 need not be adjacent terminals, but for adjacent terminals, this would be their "pitch".

In order that the beam component 1330 of the one spring contact element 1310 may overlap or cross-over the beam component 1332 of the other spring contact element 1312, it should be elevated (spaced) higher above the surface (top, as viewed) of the electronic component 1306 than the beam component 1332 of the other spring contact element 1312. To this end, the post component to which the beam component 1330 is joined should be taller, overall, than the post component to which the beam component 1332 is joined. For contacting terminals of another electronic component (not shown) which are coplanar, the tip components 1340 and 1342 of the spring contact elements 1310 and 1312, respectively, should also be coplanar, including any tip features projecting from the tip-components. Given that the beam component 1332 is disposed closer to the surface (top, as viewed) of the electronic component 1306, the tip component 1342 must be taller, overall, than the tip component 1330. These objects may be achieved in the following manner.

The overall post component of the spring contact element 1310 is fabricated as a post component 1320 joined (in the manner described hereinabove) to the terminal 1302, and a spacer component 1350 joined (in the manner described hereinabove) to the top (as viewed) surface of the post component 1320. Alternatively, the spacer component 1350 could be joined to the terminal 1302 and the post component 1320 could be joined to the spacer component 1350. Alternatively, the post component 1320 and the spacer component 1350 could be formed as an integral unitary structure.

A one end of the beam component 1330 is joined to the top (as viewed) surface of the spacer component 1350. The tip component 1340 of the spring contact element 1310 is joined to the opposite end of the beam component 1330, in the manner described hereinabove.

The overall tip component of the spring contact element 1312 is fabricated as a tip component 1342 joined (in the manner described hereinabove) to a spacer component 1352 joined (in the manner described hereinabove) to the opposite (right, as viewed) end of the beam component 1332. Alternatively, the tip component 1342 and the spacer component 1352 could be formed as an integral unitary structure. A one (left, as viewed) end of the beam component 1332 is joined to the top (as viewed) surface of the post component 1322, in the manner described hereinabove.

These same principles can be extended to a four-layer structure, where each of two structures similar to those shown in FIG. 13A have a post component and a tip component as shown. However, spacer component 1350 is made of two components. A first spacer component is approximately the thickness of beam component 1312 and preferably is formed in the same sacrificial substrate together with beam component 1312 and attached to the corresponding post component in the same sequence as beam component 1312 is attached to its corresponding post component. Similarly, spacer component 1352 is made of two components, a first component being made together with beam component 1310, each attached to a corresponding structure in the same way. A new group of spacer components are fabricated on a separate sacrificial substrate using the general methods described for making other components. Using attaching techniques as taught above, each spacer component is attached to a corresponding structure in sequence to form the second portion ("top" as shown) of a spacer component such as 1350 and a first portion ("bottom" as shown) of, another spacer component such as 1352. Such a spacer should be sufficiently thick to provide a desired offset between overlapping beam components. This can be comparable in thickness to the thickness of a beam component, but can be larger or smaller as selected by design.

As illustrated, the beam components 1330 and 1332 both extend in the y-axis, at the same x-axis coordinates. (In other words, the beam component 1330 is positioned directly over the beam component 1332, as contrasted with simply crossing over it.) If the two beam components 1330 and 1332 were the same length (as measured between their two ends), the tip components 1340 and 1342 would be spaced the same distance apart ("P2") as the terminals 1302 and 1304. However, as illustrated, the beam component 1332 is shorter (in the y-axis) than the beam component 1330. In this manner, the tip components 1340 and 1342 are space a distance "P2" apart which can be less than the distance "P1" (P2<P1). This effects a degree of space transformation (pitch spreading) with the spring contact elements themselves. For example, the electronic component 1306 can be the space transformer component of a probe card assembly, having terminals disposed at a one pitch (spacing from one another), and the tip components can be spaced at a second finer pitch.

The example of spacing the tip components at a finer pitch than the post components (e.g., than of the terminals of the electronic component) is but one example of many and various space translations that can be implemented by having the beam components of selected ones of a plurality of microelectronic contact structures crossing over or disposed above the beam components of selected other ones of the plurality microelectronic contact structures which are mounted to an electronic component.

In the manner described hereinabove, various interconnection schemes can be implemented, which would otherwise not be feasible with the one piece spring contact elements (e.g., 120, 200, 250, 300) described hereinabove.

Although the invention has been illustrated and described in detail in the drawings and foregoing description, the same is to be considered as illustrative and not restrictive in character it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. Method of mounting two microelectronic contact structures to an electronic component, comprising, for each microelectronic contact structure:

providing a post component on an electronic component;

fabricating a beam component;

fabricating a tip component comprising a tip structure;

joining the beam component to the post component; and joining the tip component to the beam component such that the tip structure extends from the beam component;

disposing the beam of a one of the two microelectronic contact structures at a substantially different height from a surface of the electronic component than the beam component of another of the two microelectronic contact structures; and disposing the tip components of each of the two microelectronic contact structures in substantially the same plane, the plane being substantially parallel to a surface of the electronic component.

2. The method of claim 1, further comprising disposing the tip components of each of the two microelectronic contact structures a first distance in a direction substantially parallel to the electronic component away from one another, and disposing the post components of each of the two microelectronic contact structures a second distance in the same direction away from one another, wherein the first distance is less than the second distance.

3. The method according to claim 1, wherein the fabricating a beam component step further comprises:

depositing a layer of masking material on a substrate;

forming an opening in the layer of masking material; and depositing at least one layer of a metallic material in the opening, thereby defining a beam component in the opening.

4. The method of claim 1, wherein the providing a post component step further comprises the steps of:

fabricating the post component on a sacrificial substrate;

joining the post component to the electronic component; and removing the sacrificial substrate.

5. The method of claim 1, wherein the fabricating a beam component step further comprises the steps of:

fabricating the beam component on a sacrificial substrate prior to the step of joining the beam component to the post component; and removing the sacrificial substrate from the beam component after the step of joining the beam component to the post component.

6. The method of claim 1, wherein the fabricating a tip component step further comprises the steps of:

fabricating the tip component on a sacrificial substrate prior to the step of joining the tip component to the beam component, the tip component comprising at least one pointed tip feature and a standoff base attached to the pointed tip feature; and removing the sacrificial substrate from the tip component after the step of joining the tip component to the beam component.

7. The method of claim 6, wherein the disposing the tip components step further comprises disposing the pointed tip features of each of the two microelectronic contact structures in the substantially the same plane.

8. In combination with an electronic component, a first contact structure and a second contact structure, each of the contact structures comprising:

a post component substantially perpendicular to the electronic component;

a beam component joined to the post component; and a tip component joined to the beam component;

wherein a portion of the beam component of one of the contact structures is disposed over the beam component of the other contact structure, wherein the tip component of the first contact structure is positioned a first distance in a direction substantially parallel to the electronic component away from the tip component of the second contact structure, the post component of the first contact structure is positioned a second distance in the same direction away from the post component of the second contact structure, and the first distance is not equal to the second distance.

9. The first and second contact structures of claim 8, wherein the beam component of each of the contact structures further comprises a metallic material deposited by a method selected from electroplating, electroless plating, sputtering, physical vapor deposition, and chemical vapor deposition.

10. The first and second contact structures of claim 8, wherein the beam component of the first contact structure is disposed at a substantially different height from a surface of the electronic component than the beam component of the second, contact structure, and the tip components of each of the first and the second contact structures are disposed in substantially the same plane, the plane being substantially parallel to a surface of the electronic component.

11. The first and second contact structures of claim 8, wherein the first distance is substantially less than the second distance.

12. The contact structures according to claim 8, wherein the post component is joined to the electronic component.

13. The contact structures according to claim 8, wherein the electronic component further comprises a first terminal and a second terminal, and wherein the post component of the first contact structure is joined to the first terminal and the post component of the second contact structure is joined to the second terminal.

14. The contact structures according to claim 8, wherein the post component of the first contact structure and the post component of the second contact structure are built up upon the electronic component.

15. The contact structures according to claim 8, wherein the tip component comprises at least one pointed tip feature and a standoff base interposed between the at least one pointed tip feature and the beam component.

* * * * *